(12) United States Patent
Nakamura et al.

(10) Patent No.: US 9,515,124 B2
(45) Date of Patent: Dec. 6, 2016

(54) MAGNETIC MEMORY, MAGNETIC MEMORY DEVICE, AND METHOD FOR MANUFACTURING MAGNETIC MEMORY

(71) Applicant: KABUSHIKI KAISHA TOSHIBA, Tokyo (JP)

(72) Inventors: Shiho Nakamura, Kanagawa (JP); Yuuzo Kamiguchi, Kanagawa (JP); Yasuaki Ootera, Kanagawa (JP); Tsuyoshi Kondo, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/829,080

(22) Filed: Aug. 18, 2015

(65) Prior Publication Data

US 2016/0056205 A1   Feb. 25, 2016

(30) Foreign Application Priority Data

Aug. 25, 2014 (JP) .................. 2014-170289

(51) Int. Cl.
| | |
|---|---|
| *H01L 27/22* | (2006.01) |
| *H01L 43/02* | (2006.01) |
| *H01L 43/08* | (2006.01) |
| *H01L 43/12* | (2006.01) |
| *G11C 11/16* | (2006.01) |
| *G11C 19/08* | (2006.01) |

(52) U.S. Cl.
CPC .......... *H01L 27/228* (2013.01); *G11C 11/161* (2013.01); *G11C 11/1675* (2013.01); *G11C 19/0808* (2013.01); *G11C 19/0841* (2013.01); *H01L 43/02* (2013.01); *H01L 43/08* (2013.01); *H01L 43/12* (2013.01)

(58) Field of Classification Search
CPC ........ H01L 27/228; H01L 43/02; H01L 43/08; H01L 43/12; G11C 11/1675; G11C 11/161; G11C 19/0808; G11C 19/0841
USPC ...................................... 257/252, 228; 438/3
See application file for complete search history.

(56) References Cited

U.S. PATENT DOCUMENTS

| | | |
|---|---|---|
| 6,834,005 B1 | 12/2004 | Parkin |
| 2004/0252539 A1 | 12/2004 | Parkin |
| 2008/0175044 A1 | 7/2008 | Maekawa et al. |

(Continued)

FOREIGN PATENT DOCUMENTS

| | | |
|---|---|---|
| JP | 2012-204802 | 10/2012 |
| JP | 5237405 | 4/2013 |

*Primary Examiner* — Yasser A Abdelaziez
(74) *Attorney, Agent, or Firm* — Finnegan, Henderson, Farabow, Garrett & Dunner LLP

(57) ABSTRACT

According to one embodiment, a magnetic memory including a first magnetic unit, a first nonmagnetic unit, a first fixed magnetic unit, a second fixed magnetic unit, a first electrode, a second electrode, and a third electrode. The first magnetic unit extends in a first direction. The first magnetic unit includes a plurality of magnetic domains arranged in the first direction. The first nonmagnetic unit contacts one end of the first magnetic unit. The first fixed magnetic unit is separated from the first magnetic unit. The first fixed magnetic unit contacts the first nonmagnetic unit. The second fixed magnetic unit is separated from the first magnetic unit and the first fixed magnetic unit. The second fixed magnetic unit is in contact with the first nonmagnetic unit. The second fixed magnetic unit is magnetized in a direction different from a magnetization direction of the first fixed magnetic unit.

15 Claims, 17 Drawing Sheets

(56) References Cited

U.S. PATENT DOCUMENTS

| | | |
|---|---|---|
| 2011/0227466 A1 | 9/2011 | Peng et al. |
| 2012/0008362 A1 | 1/2012 | Joseph et al. |
| 2012/0206959 A1 | 8/2012 | Honda et al. |
| 2012/0250398 A1 | 10/2012 | Morise et al. |
| 2013/0039122 A1* | 2/2013 | Suzuki .................... G11C 11/15 365/158 |
| 2013/0314978 A1 | 11/2013 | Currivan et al. |
| 2015/0207063 A1* | 7/2015 | Tanigawa ............ G11C 11/1675 257/421 |

* cited by examiner

MAGNETIC MEMORY, MAGNETIC MEMORY DEVICE, AND METHOD FOR MANUFACTURING MAGNETIC MEMORY

CROSS-REFERENCE TO RELATED APPLICATIONS

This application is based upon and claims the benefit of priority from Japanese Patent Application No.2014-170289, filed on Aug. 25, 2014; the entire contents of which are incorporated herein by reference.

FIELD

Embodiments described herein relate generally to a magnetic memory, a magnetic memory device, and a method for manufacturing magnetic memory.

BACKGROUND

Spin shift register magnetic memory that uses domain walls has been proposed as a method for realizing higher-capacity memory. Such magnetic memory includes a magnetic unit extending in a prescribed direction, a read-out unit, and a write unit. For the magnetic memory, it is desirable to develop technology for easily reading and writing information from and to the magnetic unit.

DETAILED DESCRIPTION

Figure 1:
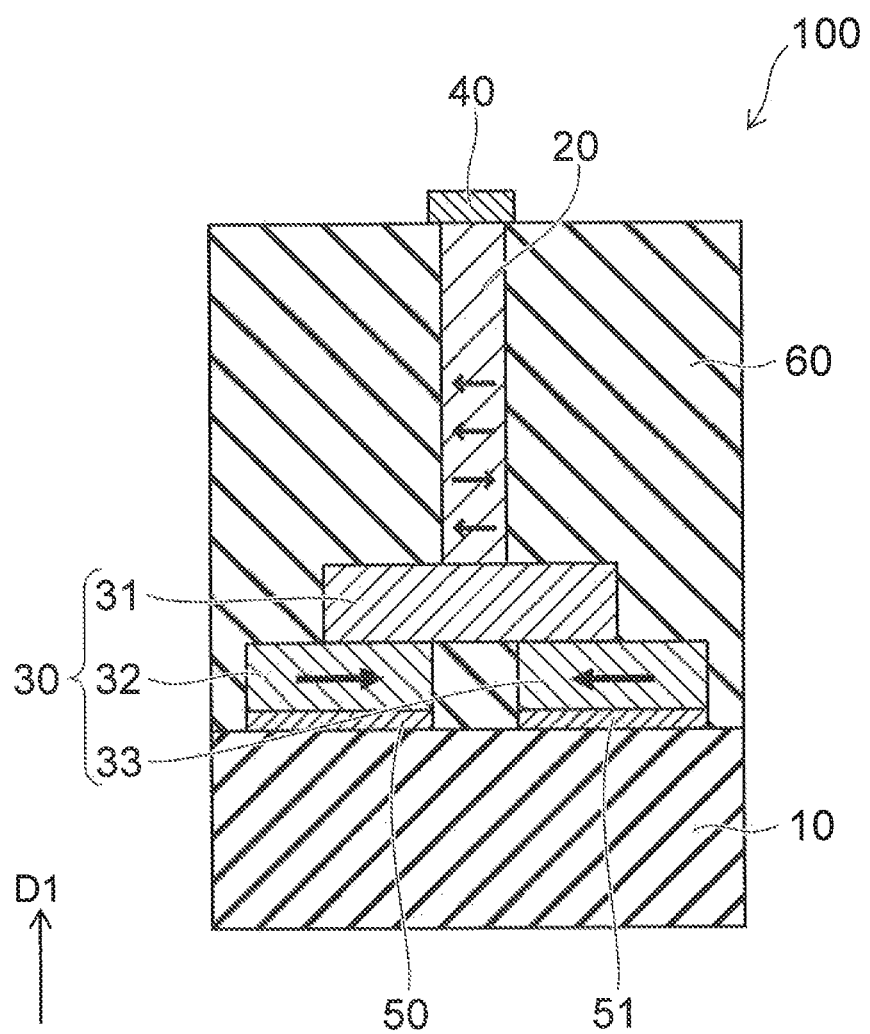
FIG. 1 is a cross-sectional view of the magnetic memory 100 according to the first embodiment.

According to one embodiment, a magnetic memory including a first magnetic unit, a first nonmagnetic unit, a first fixed magnetic unit, a second fixed magnetic unit, a first electrode, a second electrode, and a third electrode. The first magnetic unit extends in a first direction. The first magnetic unit includes a plurality of magnetic domains arranged in the first direction. The first nonmagnetic unit contacts one end of the first magnetic unit. The first fixed magnetic unit is separated from the first magnetic unit. The first fixed magnetic unit contacts the first nonmagnetic unit. The second fixed magnetic unit is separated from the first magnetic unit and the first fixed magnetic unit. The second fixed magnetic unit is in contact with the first nonmagnetic unit. The second fixed magnetic unit is magnetized in a direction different from a magnetization direction of the first fixed magnetic unit. The first electrode is connected to one other end of the first magnetic unit. The second electrode is connected to the first fixed magnetic unit. The third electrode is connected to the second fixed magnetic unit.

DESCRIPTION OF EMBODIMENTS

Embodiments of the invention will now be described with reference to the drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even in the case where the same portion is illustrated.

In the drawings and the specification of the application, components similar to those described in regard to a drawing thereinabove are marked with like reference numerals, and a detailed description is omitted as appropriate.

In some of the drawings, the magnetization directions are illustrated by arrows inside components including magnetic materials.

In some of the drawings, the magnetization directions are illustrated by arrows only for some of the magnetic domains included in a magnetic unit 20.

First Embodiment

A magnetic memory 100 according to the embodiment will now be described using FIG. 1.

FIG. 1 is a cross-sectional view of the magnetic memory 100 according to the first embodiment.

The magnetic memory 100 is provided on a substrate 10. The arrows in FIG. 1 show an example of the magnetization directions. Other than the magnetic memory 100, an integrated circuit may be mounted on the substrate 10.

The magnetic memory 100 includes the magnetic unit 20, a write/read-out unit 30, an electrode (a first electrode) 40, an electrode (a second electrode) 50, and an electrode (a third electrode) 51. The write/read-out unit 30 includes a nonmagnetic unit 31, a first fixed magnetic unit 32, and a second fixed magnetic unit 33.

The magnetic unit 20 includes, for example, a wire including a magnet. The magnetic unit 20 extends in the normal direction (a first direction) of the front surface of the substrate 10. The magnetic unit 20 includes multiple magnetic domains arranged in the first direction. The magnetic unit 20 includes one end and one other end. The one end of the magnetic unit 20 contacts the nonmagnetic unit 31 included in the write/read-out unit 30. The electrode 40 is connected to the other end of the magnetic unit 20.

The first direction is, for example, a direction D1 shown in FIG. 1.

A rectangle, a square, a circle, an ellipse, or the like is employable as the cross-sectional configuration of the magnetic unit 20. A nonmagnet may be filled into the center of the cross-sectional configuration of the magnetic unit 20. The width of the magnetic unit 20 is not less than 0.5 nm and not more than 500 nm. The width corresponds to a dimension in a direction orthogonal to the first direction. The length of the magnetic unit 20 in the first direction is, for example, not less than 50 nm and not more than 100 µm. The length of the magnetic unit 20 may be determined by the data capacity of the magnetic memory 100.

The magnetic unit 20 may include a material including at least one selected from cobalt (Co), iron (Fe), nickel (Ni), manganese (Mn), and chrome (Cr). Or, the magnetic unit 20 may include an alloy in which these materials are combined. Or, the magnetic unit 20 may include a multilayered film including layers of these materials. Or, the magnetic unit 20 may include a rare earth-transition metal amorphous alloy film such as TbFeCo, etc., made of an alloy of a rare earth metal and a 3d transition metal. Or, the magnetic unit 20 may include a multilayered film such as a Co/Ni multilayered film, a Co/Pd multilayered film, etc. Or, the magnetic unit 20 may include an ordered alloy such as FePt, CoPt, FePd, etc.

It is favorable for the magnetization direction of the magnetic unit 20 to be orthogonal to the first direction to retain the magnetic domains in the magnetic unit 20 more stably at a higher density. By using the materials described above, it is possible to form the magnetic unit 20 having perpendicular magnetic anisotropy in which the direction orthogonal to the first direction is the easy magnetization axis. By using the magnetic unit 20 having the easy magnetization axis in the direction orthogonal to the first direction, it becomes easy to magnetize the magnetic unit 20 in the direction orthogonal to the first direction.

Other than selecting such materials, the easy magnetization axis of the magnetic unit 20 can be set to be oriented in the direction orthogonal to the first direction by using magnetostriction or by aligning the crystal orientation of the magnetic unit 20. Or, a combination of controlling the magnetostriction and/or the crystal orientation and applying the materials described above may be used. The magnetization direction of the magnetic unit 20 may be oriented in different directions orthogonal to the first direction at points in a prescribed plane orthogonal to the first direction.

The nonmagnetic unit 31 has a surface parallel to the front surface of the substrate 10. Therefore, the dimensions of the nonmagnetic unit 31 in directions parallel to the front surface of the substrate 10 can be increased; and the alignment with the magnetic unit 20 is easy. The dimensions of the nonmagnetic unit 31 in the directions parallel to the front surface of the substrate 10 are, for example, not less than 0.6 nm and not more than 20 µm. The nonmagnetic unit 31 may include copper, aluminum, silver, or silicon. Or, the nonmagnetic unit 31 may include an alloy including at least one of these materials. Or, the nonmagnetic unit 31 may include graphite including graphene. The film thickness of the nonmagnetic unit 31 is, for example, not less than 0.1 nm and not more than 50 nm.

The first fixed magnetic unit 32 and the second fixed magnetic unit 33 are provided in contact with the nonmagnetic unit 31. The nonmagnetic unit 31 is provided between the first fixed magnetic unit 32 and the magnetic unit 20 and between the second fixed magnetic unit 33 and the magnetic unit 20. In other words, the magnetic unit 20 is provided on the side of the nonmagnetic unit 31 opposite to the first fixed magnetic unit 32 and the second fixed magnetic unit 33. According to such a configuration, it is possible to provide the magnetic unit 20 and the fixed magnetic units 32 and 33 at a higher density.

The first fixed magnetic unit 32 and the second fixed magnetic unit 33 are provided to be separated from each other. The first fixed magnetic unit 32 and the second fixed magnetic unit 33 have surfaces parallel to the front surface of the substrate 10. The film thicknesses of the first fixed magnetic unit 32 and the second fixed magnetic unit 33 are, for example, not less than 0.4 nm and not more than 100 nm.

The magnetization direction of the first fixed magnetic unit 32 is different from the magnetization direction of the second fixed magnetic unit 33. It is sufficient for the magnetization direction of the first fixed magnetic unit 32 and the magnetization direction of the second fixed magnetic unit 33 to be different enough that the writing of the magnetization direction to the magnetic unit 20 and the reading of the magnetization direction of the magnetic unit 20 described below are possible. Favorably, the magnetization direction of the first fixed magnetic unit 32 and the magnetization direction of the second fixed magnetic unit 33 are mutually-opposite directions. In the description of the embodiment of the application, the state in which two such directions are opposite to each other is called antiparallel. It is favorable for the magnetization direction of the first fixed magnetic unit 32 and the magnetization direction of the second fixed magnetic unit 33 to be directions in a plane parallel to the front surface of the substrate 10. It is desirable for the first fixed magnetic unit 32 and the second fixed magnetic unit 33 to be magnetized so that the magnetization direction of the first fixed magnetic unit 32 and the magnetization direction of the second fixed magnetic unit 33 are parallel to the easy magnetization axis direction of the magnetic unit 20. It is favorable for the first fixed magnetic unit 32 and the second fixed magnetic unit 33 to be provided with line symmetry with respect to the magnetic unit 20 to more stably perform the writing operation of the magnetic unit 20.

The first fixed magnetic unit 32 and the second fixed magnetic unit 33 may include materials including at least one selected from Co, Fe, Ni, Mn, and Cr. Or, the first fixed magnetic unit 32 and the second fixed magnetic unit 33 may include alloys in which these materials are combined. The first fixed magnetic unit 32 and the second fixed magnetic unit 33 may include CoFeMnSi, CoFeMnGe, or a Heusler alloy such as CoFeSi or CoFeGe. The efficiency of writing and reading can be increased by using a Heusler alloy.

Methods for setting the magnetization direction of the first fixed magnetic unit 32 and the magnetization direction of the second fixed magnetic unit 33 to be in an antiparallel state include the following methods. The first method is to set the material of the first fixed magnetic unit 32 to be different from the material of the second fixed magnetic unit 33. The second method is to irradiate ions into at least one of the first fixed magnetic unit 32 or the second fixed magnetic unit 33. According to such methods, the magnetic anisotropy of at least one of the first fixed magnetic unit 32 or the second fixed magnetic unit 33 changes; and the first fixed magnetic unit 32 and the second fixed magnetic unit 33 can be made to have mutually-different coercive forces.

The electrode 50 is connected to the first fixed magnetic unit 32. The electrode 51 is connected to the second fixed magnetic unit 33. The electrodes 50 and 51 are used to cause current to flow when writing and reading to and from the magnetic memory 100 and when moving the domain walk of the magnetic unit 20.

An insulating unit 60 is provided around the magnetic unit 20, the nonmagnetic unit 31, the first fixed magnetic unit 32, and the second fixed magnetic unit 33. The insulating unit 60 may include an oxide such as aluminum oxide or silicon oxide, a nitride such as silicon nitride, or an insulative polymer.

Operations of the magnetic memory 100 will now be described. FIG. 2A to FIG. 5 are used to describe the operations of the magnetic memory 100.

Figure 2A:
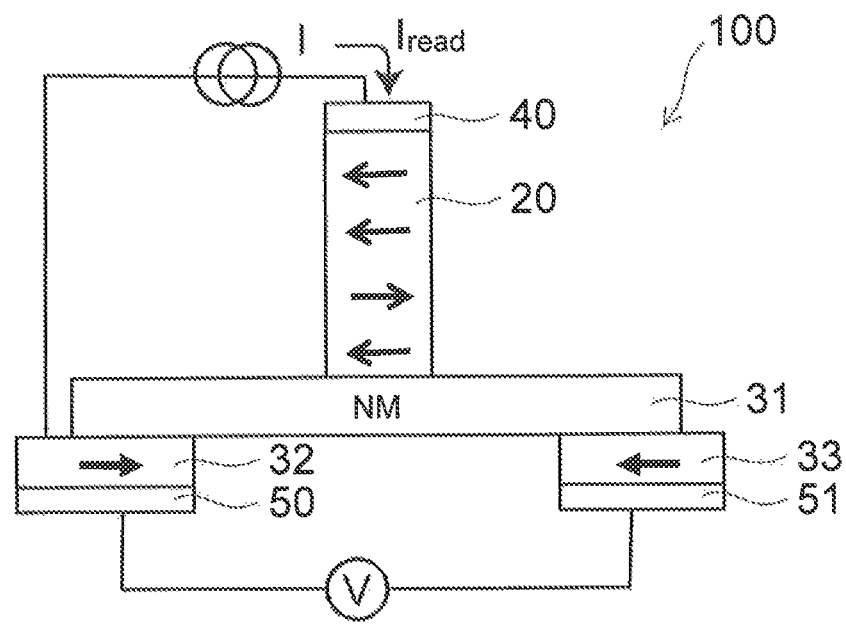
FIGS. 2A and 2B are schematic views used to describe the operations of the magnetic memory.
Figure 2B:
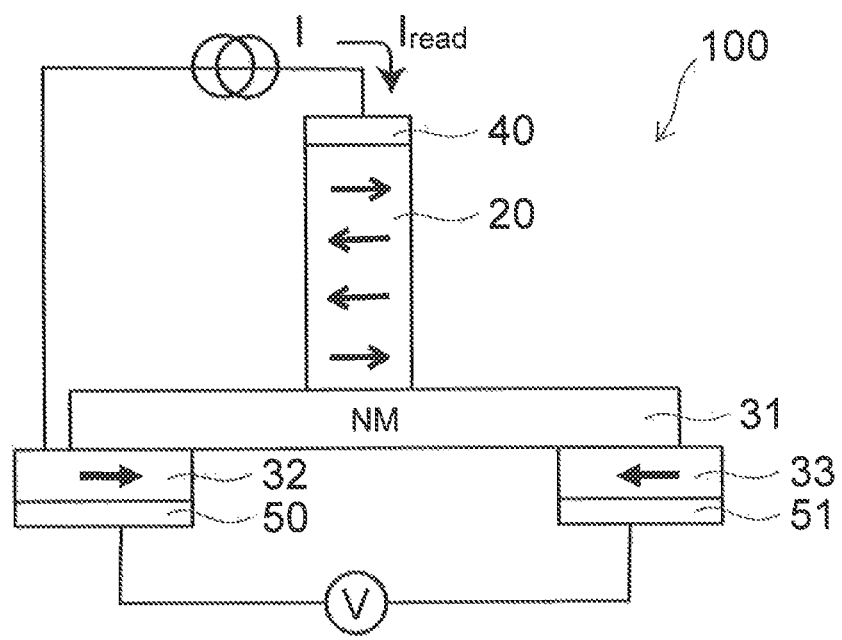

FIGS. 2A and 2B are used to describe the read-out operation of the magnetic memory 100. A read-out current $I_{read}$ is caused to flow between the electrode 40 and the electrode 50; and the magnetization direction in the region of the magnetic unit contacting the nonmagnetic unit 31 is read from the voltage generated between the electrode 50 and the electrode 51 when the current $I_{read}$ is caused to flow.

The voltage that is generated between the electrode 50 and the electrode 51 is different between the state shown in FIG. 2A and the state shown in FIG. 2B. Namely, the voltage that is generated between the electrode 50 and the electrode 51 is different between the case where the magnetization direction of the first fixed magnetic unit 32 is different from the magnetization direction in the region of the magnetic unit 20 contacting the nonmagnetic unit 31 and the case where the magnetization direction of the first fixed magnetic unit 32 is the same as the magnetization direction in the region of the magnetic unit 20 contacting the nonmagnetic unit 31. Accordingly, the magnetization direction in the region contacting the nonmagnetic unit 31 can be read by sensing the voltage between the electrode 50 and the electrode 51.

To make the difference larger between the voltage generated between the electrode 50 and the electrode 51 in the state shown in FIG. 2A and the voltage generated between the electrode 50 and the electrode 51 in the state shown in FIG. 2B, it is desirable for the magnetization direction of the first fixed magnetic unit 32 and the magnetization direction of the second fixed magnetic unit 33 to be antiparallel. As the difference increases between the voltage generated between the electrode 50 and the electrode 51 in the state shown in FIG. 2A and the voltage generated between the electrode 50 and the electrode 51 in the state shown in FIG. 2B, it becomes easier to read the magnetization direction in the region contacting the nonmagnetic unit 31.

There are cases where a spin-motive force is generated by heat generation due to the current, etc., and the voltage output is biased by the spin-motive force. Even in such a case, it is possible to determine the magnetization direction in the region of the magnetic unit contacting the nonmagnetic unit 31 by determining the magnitude of the voltage output using a criterion considering the heat generation beforehand.

Although the case is shown in FIGS. 2A and 2B where the current $I_{read}$ is caused to flow between the electrode 40 and the electrode 50, the voltage between the electrode 50 and the electrode 51 may be sensed while causing the current $I_{read}$ to flow between the electrode 40 and the electrode 51.

Figure 3:
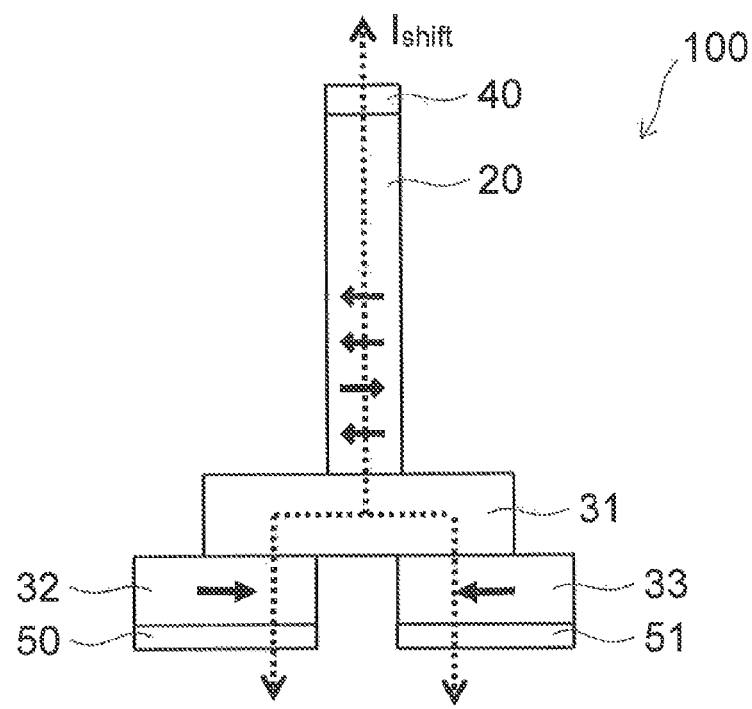
FIG. 3 is schematic view used to describe the shift operation of the domain walls of the magnetic memory.

FIG. 3 is used to describe a shift operation of the domain walls of the magnetic memory 100.

After reading one bit (the magnetization information of one magnetic domain), the domain walls are shifted. As in FIG. 3, the shift of the domain walls is performed by causing a shift current $I_{shift}$ to flow between the electrode 40 and at least one of the electrode 50 or the electrode 51. The absolute value of $I_{shift}$ is greater than the absolute value of the read-out current $I_{read}$. The shift current is caused to flow in the direction causing the bits (the domain walls) to move toward the nonmagnetic unit. The data is sequentially read from the magnetic memory 100 by repeating the shift operation of the bits and the read-out operation of the bit.

Figure 4:
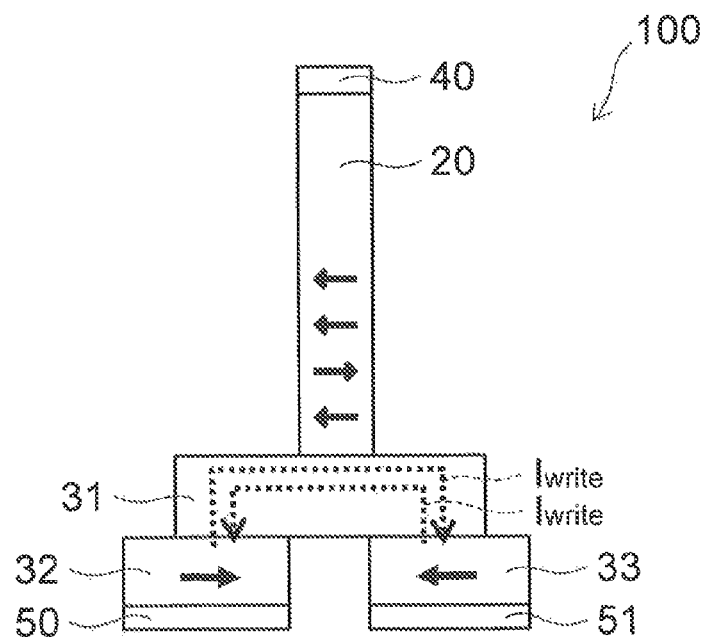
FIG. 4 is schematic view used to describe the writing operation of the magnetic memory.

FIG. 4 is used to describe the writing operation of the magnetic memory 100. A current is caused to flow between the electrode 50 and the electrode 51; and the magnetization direction in the region of the magnetic unit 20 contacting the nonmagnetic unit 31 is controlled to correspond to the direction in which the current $I_{write}$ flows, The direction of the magnetization written to the magnetic unit 20 is determined by the orientation of the writing current. The magnetization that is written aligns with the magnetization of the first fixed magnetic unit 32 or the second fixed magnetic unit 33 from which an electron current Ie having the reverse orientation to the orientation of the writing current flows. The writing is performed by causing the spin-transfer torque to propagate via the nonmagnetic unit 31 from each of the fixed magnetic units toward the magnetic unit 20.

In the magnetic memory 100, after controlling (writing) the magnetization direction of the magnetic domain corresponding to one bit, the shift current $I_{shift}$ is caused to flow between the electrode 40 and at least one of the electrode 50 or the electrode 51. The domain walls (the magnetic domains) inside the magnetic unit 20 are shifted a distance corresponding to one bit by the shift current $I_{shift}$. The orientation of the shift current in the writing is the reverse of the orientation of the shift current in the reading. In other words, the shift current is caused to flow in the direction causing the bits (the domain walls) to move toward the electrode 40. The data is written sequentially to the magnetic memory 100 by repeating the shift operation of the bits and the writing operation of the bit.

Figure 5:
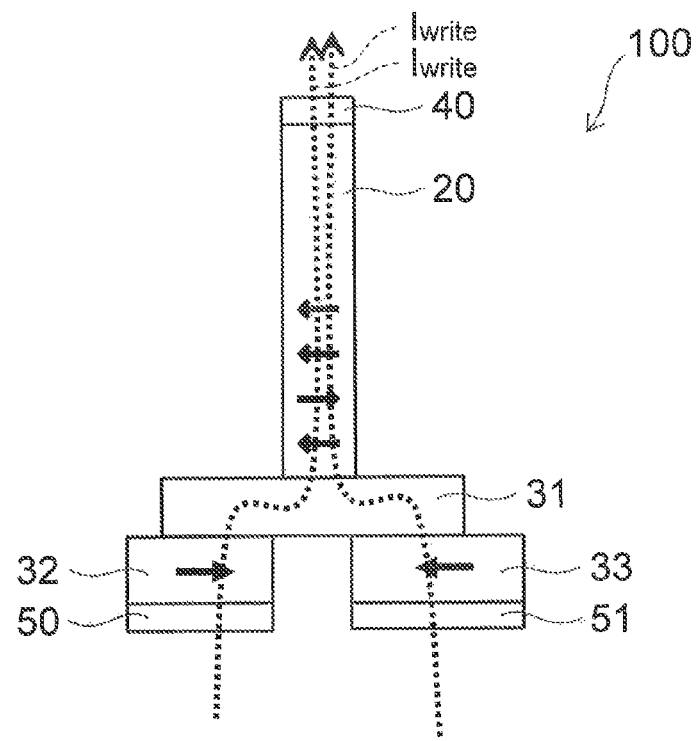
FIG. 5 is schematic view used to describe another writing method of the magnetic memory.

FIG. 5 is used to describe another writing method of the magnetic memory 100. In the writing method, the domain walls can be shifted simultaneously with the writing. The magnetization of the portion of the magnetic unit 20 contacting the nonmagnetic unit 31 can be aligned with the magnetization of one of the first fixed magnetic unit 32 or the second fixed magnetic unit 33 from which the electron current Ie flows by causing the electron current to flow toward the electrode 40 from the electrode contacting the fixed magnetic unit having the magnetization direction to be written. In the method, it is possible to shift the domain walls simultaneously with the writing by setting $I_{write}$ to be larger than $I_{shift}$.

The operations of writing, reading, shifting the domain walls, etc., described above are performed using a current source circuit and a voltage sensor described below.

In the embodiment as described above, magnetization information is written and read directly to and from the magnetic unit 20 extending in the first direction via the nonmagnetic unit 31. Accordingly, it is possible to read and write the magnetization information from and to the magnetic unit 20 more easily than for a configuration in which a magnetic wire is connected to one end of the magnetic unit extending in the first direction, two fixed magnetic units are provided for the magnetic wire, and the domain walls are moved between the magnetic wire and the magnetic units.

Second Embodiment

A magnetic memory 200 according to a second embodiment will now be described using FIG. 6.

Figure 6:
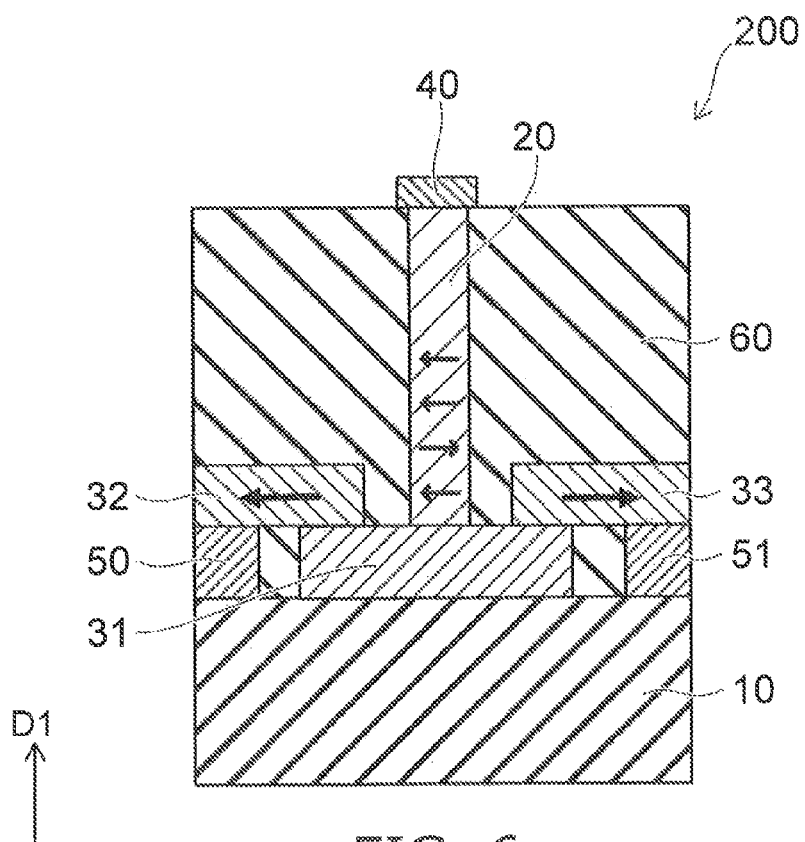
FIG. 6 is a cross-sectional view of the magnetic memory according to the second embodiment.

FIG. 6 is a cross-sectional view of the magnetic memory 200 according to the second embodiment.

The magnetic memory 200 differs from the magnetic memory 100 in that the magnetic unit 20, the first fixed magnetic unit 32, and the second fixed magnetic unit 33 are provided on the same side of the nonmagnetic unit 31.

In the embodiment as well, similarly to the first embodiment, it is possible to easily read and write the magnetization directions of the magnetic domains from and to the magnetic unit 20.

In a configuration other than that shown in FIG. 6, for example, the first fixed magnetic unit 32 and the second fixed magnetic unit 33 may be provided at sides of the nonmagnetic unit 31 in contact with the nonmagnetic unit 31. In such a case, the first fixed magnetic unit 32 is provided to contact one end of the side portion of the nonmagnetic unit 31; and the second fixed magnetic unit 33 is provided to contact one other end of the side portion of the nonmagnetic unit 31.

Third Embodiment

A magnetic memory 300 according to a third embodiment will now be described using FIG. 7.

Figure 7:
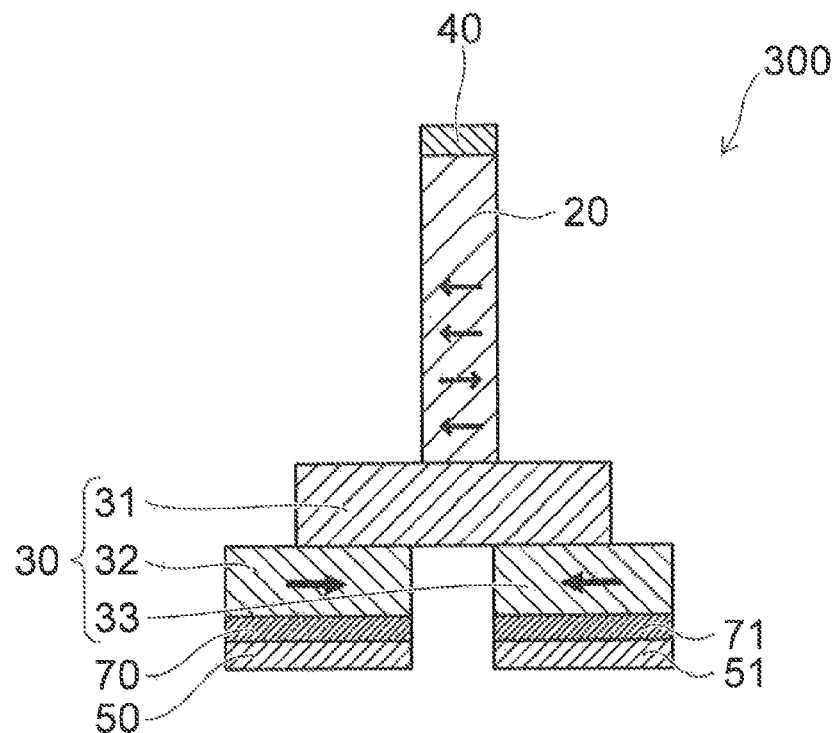
FIG. 7 is a cross-sectional view of the magnetic memory according to the third embodiment.

FIG. 7 is a cross-sectional view of the magnetic memory 300 according to the third embodiment.

The magnetic memory 300 differs from the magnetic memory 100 in that a first antiferromagnetic unit 70 is provided between the first fixed magnetic unit 32 and the electrode 50; and a second antiferromagnetic unit 71 is provided between the second fixed magnetic unit 33 and the electrode 51. In the embodiment, for example, the magnetization of the first fixed magnetic unit 32 and the magnetization of the second fixed magnetic unit 33 can be set to antiparallel states by setting the Néel temperature of the first antiferromagnetic unit 70 to be different from the Néel temperature of the second antiferromagnetic unit 71.

Fourth Embodiment

A magnetic memory 400 according to a fourth embodiment will now be described using FIG. 8.

Figure 8:
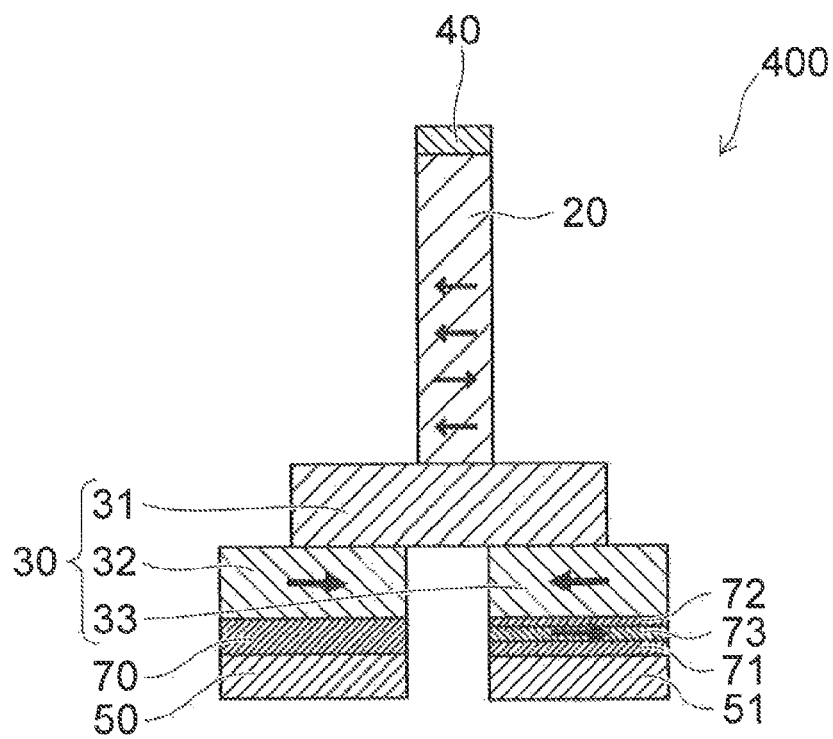
FIG. 8 is a cross-sectional view of the magnetic memory according to the fourth embodiment.

FIG. 8 is a cross-sectional view of the magnetic memory 400 according to the fourth embodiment.

The magnetic memory 400 differs from the magnetic memory 300 in that a fourth fixed magnetic unit 73 and a nonmagnetic unit 72 made of a nonmagnet such as Ru, etc., are included between the second fixed magnetic unit 33 and the second antiferromagnetic unit 71.

The nonmagnetic unit (a third nonmagnetic unit) 72 is provided so that the second fixed magnetic unit 33 is positioned between the nonmagnetic unit (the third nonmagnetic unit) 72 and the nonmagnetic unit (a first nonmagnetic unit) 31. The fourth fixed magnetic unit 73 is provided so that the nonmagnetic unit 72 is positioned between the fourth fixed magnetic unit 73 and the second fixed magnetic unit 33. The second antiferromagnetic unit 71 is provided so that the fourth fixed magnetic unit 73 is positioned between the second antiferromagnetic unit 71 and the nonmagnetic unit 72.

In the embodiment, the magnetization direction of the second fixed magnetic unit 33 can be set to be antiparallel to the magnetization direction of the first fixed magnetic unit 32 by an exchange interaction with the fourth fixed magnetic unit 73.

Fifth Embodiment

A magnetic memory 500 according to a fifth embodiment will now be described using FIG. 9.

Figure 9:
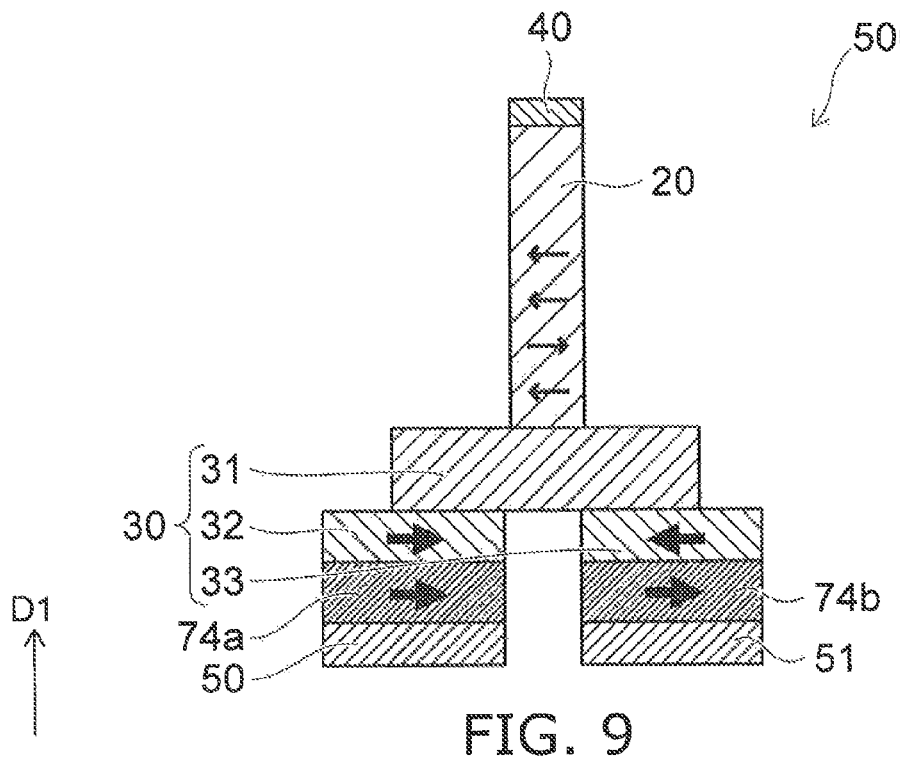
FIG. 9 is a cross-sectional view of the magnetic memory according to the fifth embodiment.

FIG. 9 is a cross-sectional view of the magnetic memory 500 according to the fifth embodiment.

The magnetic memory 500 differs from the magnetic memory 100 in that a first magnetization direction adjuster 74a is provided between the first fixed magnetic unit 32 and the electrode 50; and a second magnetization direction adjuster 74b is provided between the second fixed magnetic unit 33 and the electrode 51.

The first magnetization direction adjuster 74a and the second magnetization direction adjuster 74b include magnetic materials in which a combination of the spin polarization direction and the magnetization direction is adjusted. For example, the first and second magnetization direction adjusters include rare earth-3d transition metal amorphous alloys. The first magnetization direction adjuster 74a includes a rare earth-3d transition metal rich in a 3d transition metal such as Fe, Co, and Ni; and the second magnetization direction adjuster 74b includes a rare earth-3d transition metal rich in a rare earth metal such as Tb, Gd. Or, in the second magnetization direction adjuster 74b, the magnetic moment of the rare earth metal is weakened by an added element such as oxygen, etc. The magnetizations of the first fixed magnetic unit 32 and the second fixed magnetic unit 33 can be set to antiparallel states by applying external magnetic fields to the first and second fixed magnetic units and the first and second magnetization direction adjusters.

Sixth Embodiment

A magnetic memory 600 according to a sixth embodiment will now be described using FIG. 10.

Figure 10:
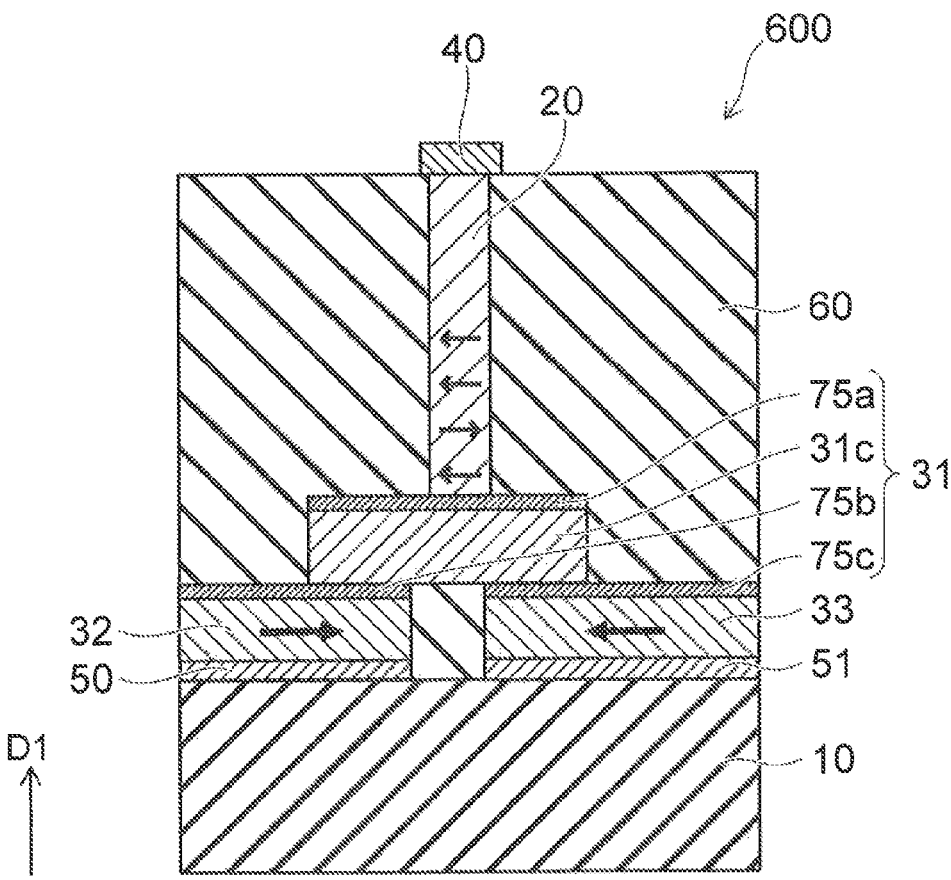
FIG. 10 is a cross-sectional view of the magnetic memory according to the sixth embodiment.

FIG. 10 is a cross-sectional view of the magnetic memory 600 according to the sixth embodiment.

The magnetic memory 600 differs from the magnetic memory 100 in that the nonmagnetic unit 31 includes insulating layers 75a, 75b, and 75c. The nonmagnetic unit 31 includes insulating layers (barrier layers) made of magnesium oxide, aluminum oxide, etc., and a nonmagnetic unit 31c of a metal including copper (Cu), etc. The insulating layer 75a is provided between the nonmagnetic unit 31c and the magnetic unit 20. The insulating layer 75b is provided between the nonmagnetic unit 31c and the first fixed magnetic unit 32. The insulating layer 75c is provided between the nonmagnetic unit 31c and the second fixed magnetic unit 33. It is unnecessary for the nonmagnetic unit 31 to include all of the insulating layers 75a, 75b, and 75c; and it is sufficient for the nonmagnetic unit 31 to include at least one of the insulating layers 75a, 75b, or 75c. By the nonmagnetic unit 31 including the at least one of the insulating layers 75a, 75b, or 75c, the output voltage in the signal read-out can be large.

In the case where the nonmagnetic unit 31 includes a barrier layer at the boundary portion between the nonmagnetic unit 31c and the magnetic unit 20, it is favorable to write the information to the magnetic unit 20 by causing the current $I_{write}$ to flow between the electrode 40 and at least one of the electrodes 50 or 51 to make it easier to write to the magnetic unit 20.

Seventh Embodiment

A magnetic memory 700 according to a seventh embodiment will now be described using FIG. 11.

Figure 11:
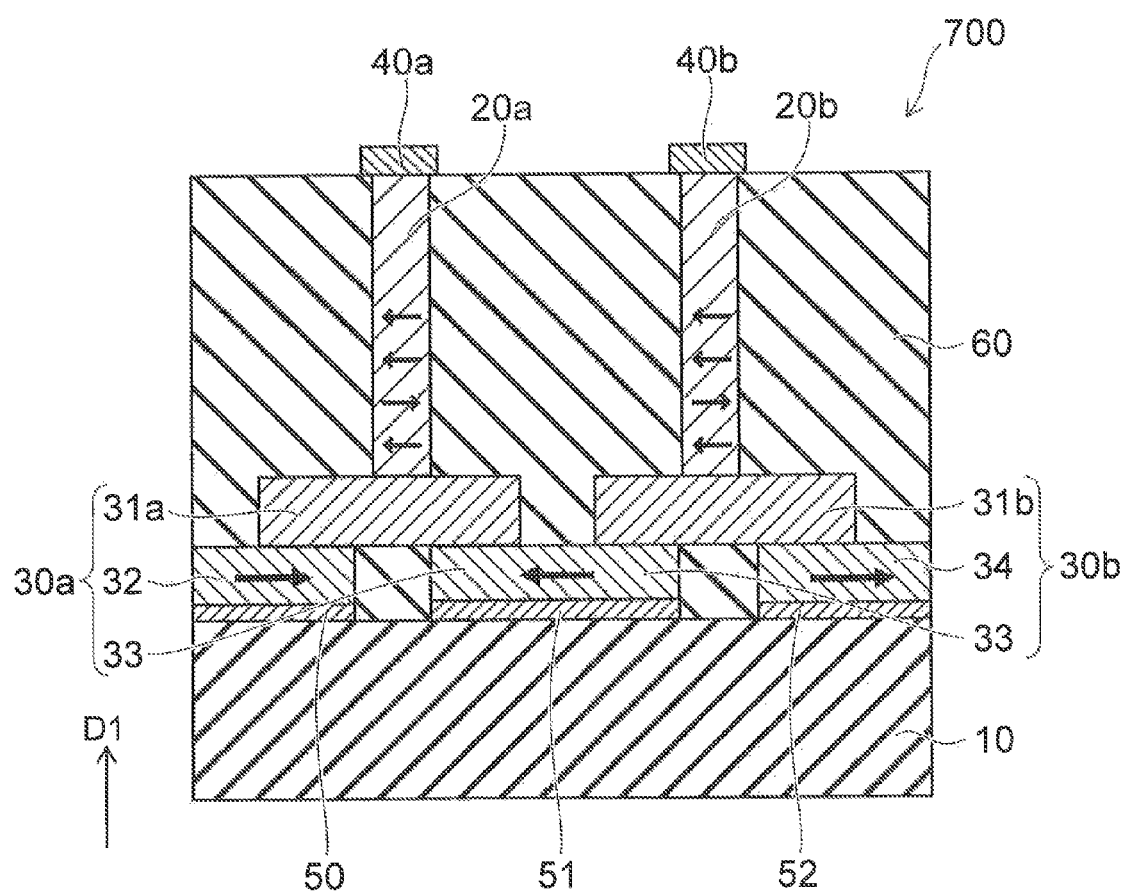
FIG. 11 is a cross-sectional view of the magnetic memory according to the seventh embodiment.

FIG. 11 is a cross-sectional view of the magnetic memory 700 according to the seventh embodiment.

The magnetic memory 700 includes a magnetic unit 20a, a nonmagnetic unit 31a, the first fixed magnetic unit 32, the second fixed magnetic unit 33, an electrode 40a, the electrode 50, and the electrode 51. The magnetic memory 700 further includes a magnetic unit (a second magnetic unit) 20b, a nonmagnetic unit (a second nonmagnetic unit) 31b, a third fixed magnetic unit 34, an electrode (a fourth electrode) 40b, and an electrode (a fifth electrode) 52. A write/read-out unit 30b includes the nonmagnetic unit 31b, the second fixed magnetic unit 33, and the third fixed magnetic unit 34. The magnetization direction of the third fixed magnetic unit 34 is different from the magnetization direction of the second fixed magnetic unit 33. It is favorable for the magnetization direction of the third fixed magnetic unit 34 to be opposite to the magnetization direction of the second fixed magnetic unit 33. The nonmagnetic unit 31a and the nonmagnetic unit 31b are separated from each other and are provided in contact with the second fixed magnetic unit 33. In other words, the nonmagnetic unit 31a and the nonmagnetic unit 31b share the second fixed magnetic unit 33.

As described in the third embodiment and the fourth embodiment, antiferromagnetic layers, nonmagnetic layers, and other fixed magnetic units may be provided to be adjacent to the first to third fixed magnetic units 32 to 34. As described in the sixth embodiment, the nonmagnetic units 31a and 31b may include barrier layers.

According to such a configuration, it is possible to reduce the number of fixed magnetic units necessary for one magnetic unit; and it is possible to increase the bit density of the magnetic memory.

By dividing the nonmagnetic unit 31 to correspond to each magnetic unit 20, the diffusion of the spin-polarized electrons stored in the nonmagnetic unit 31 can be prevented. Therefore, it is possible to increase the output in the read-out and reduce the writing current in the writing.

Eighth Embodiment

A magnetic memory 800 according to an eighth embodiment will now be described using FIG. 12.

Figure 12:
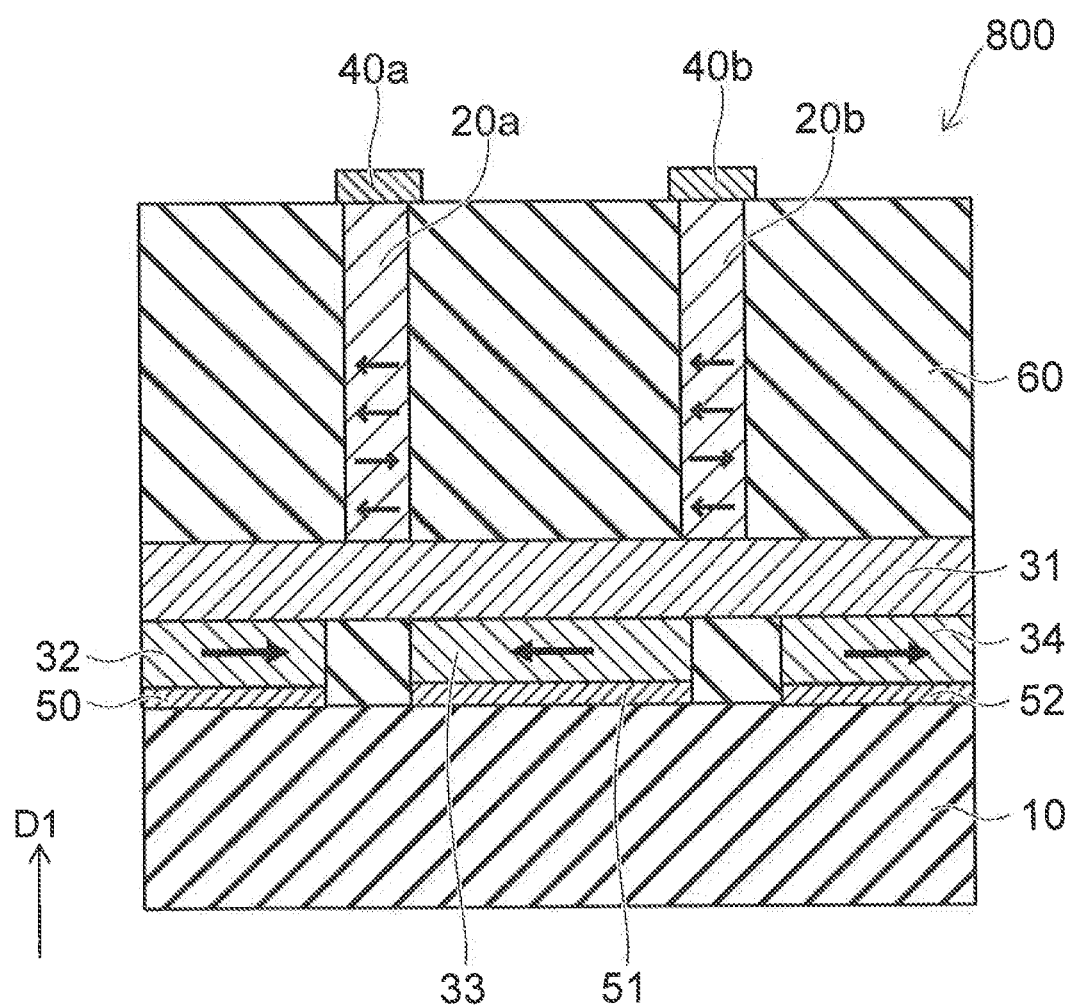
FIG. 12 is a cross-sectional view of the magnetic memory according to the eighth embodiment.

FIG. 12 is a cross-sectional view of the magnetic memory 800 according to the eighth embodiment.

The magnetic memory 800 differs from the magnetic memory 700 in that a common nonmagnetic unit 31 is provided for multiple magnetic units and multiple fixed magnetic units.

In the embodiment, when projected onto a plane orthogonal to the first direction, at least a portion of the magnetic unit 20a is positioned between the first fixed magnetic unit 32 and the second fixed magnetic unit 33; and at least a portion of the magnetic unit 20b is positioned between the second fixed magnetic unit 33 and the third fixed magnetic unit 34.

According to the embodiment, the manufacturing is easy because it is unnecessary to divide the nonmagnetic unit to correspond to each magnetic unit.

Figure 13:
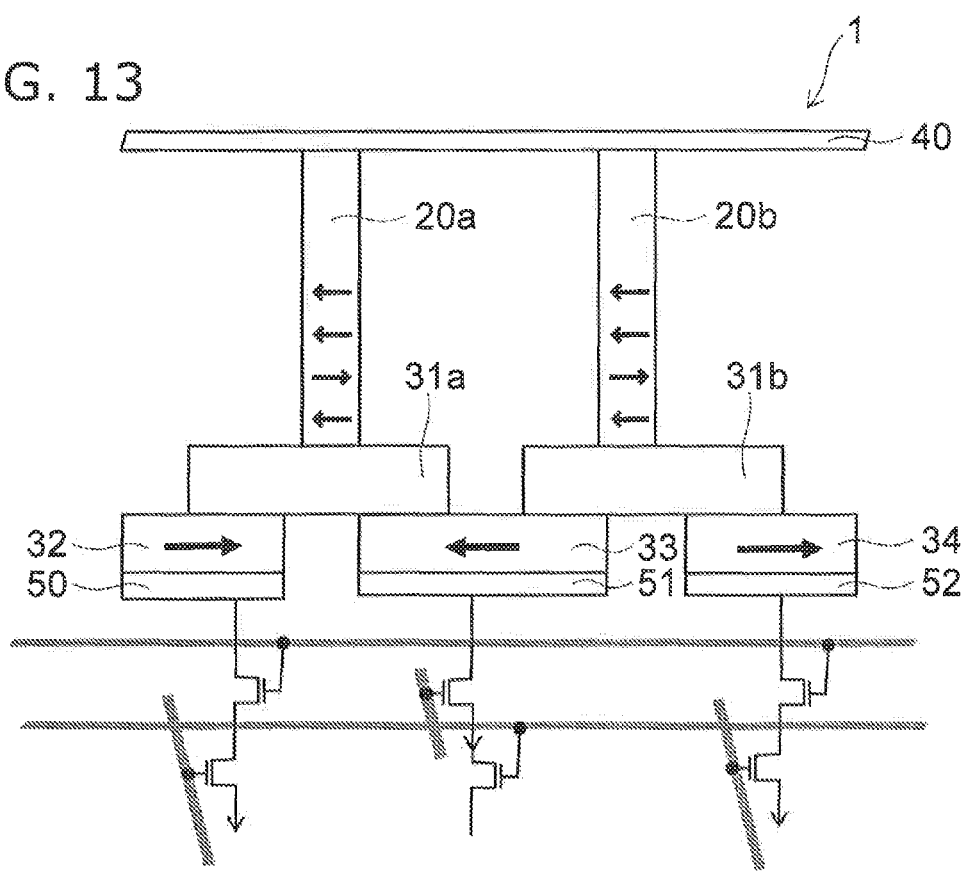
FIG. 13 shows a structure example for arranging the magnetic memory in an array configuration.
Figure 14:
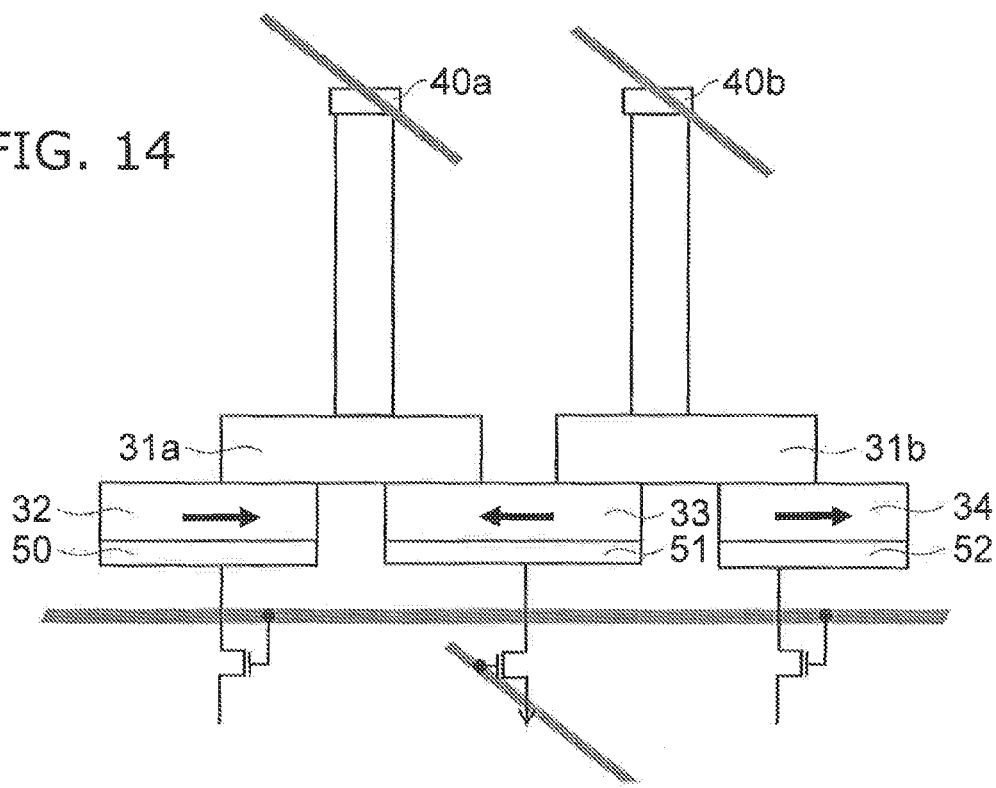
FIG. 14 shows a structure example for arranging the magnetic memory in an array configuration.

FIG. 13 and FIG. 14 show a structure example for arranging the magnetic memory 700 in an array configuration. Some of the electrodes are not shown for easier understanding of the drawings.

In the case where the magnetic memory 700 is multiply connected, a common electrode 40 such as that shown in FIG. 13 is provided; and each of magnetic units 20 can be connected to the common electrode 40. The electrodes 50 and 51 are connected to the current source circuit or the voltage sensor via two selection transistors each. Each of the gate electrodes of the selection transistors are connected to a word line.

As shown in FIG. 14, each of electrodes 40 may be connected to the corresponding bit line BL instead of the common electrode 40. In FIG. 14, the electrodes 50 and 51 are connected to the current source circuit or the voltage sensor via one selection transistor each. Each of the gate electrodes of the selection transistors is connected to a word line.

In the description hereinbelow, a device including multiple magnetic memory is called a magnetic memory device.

Figure 15:
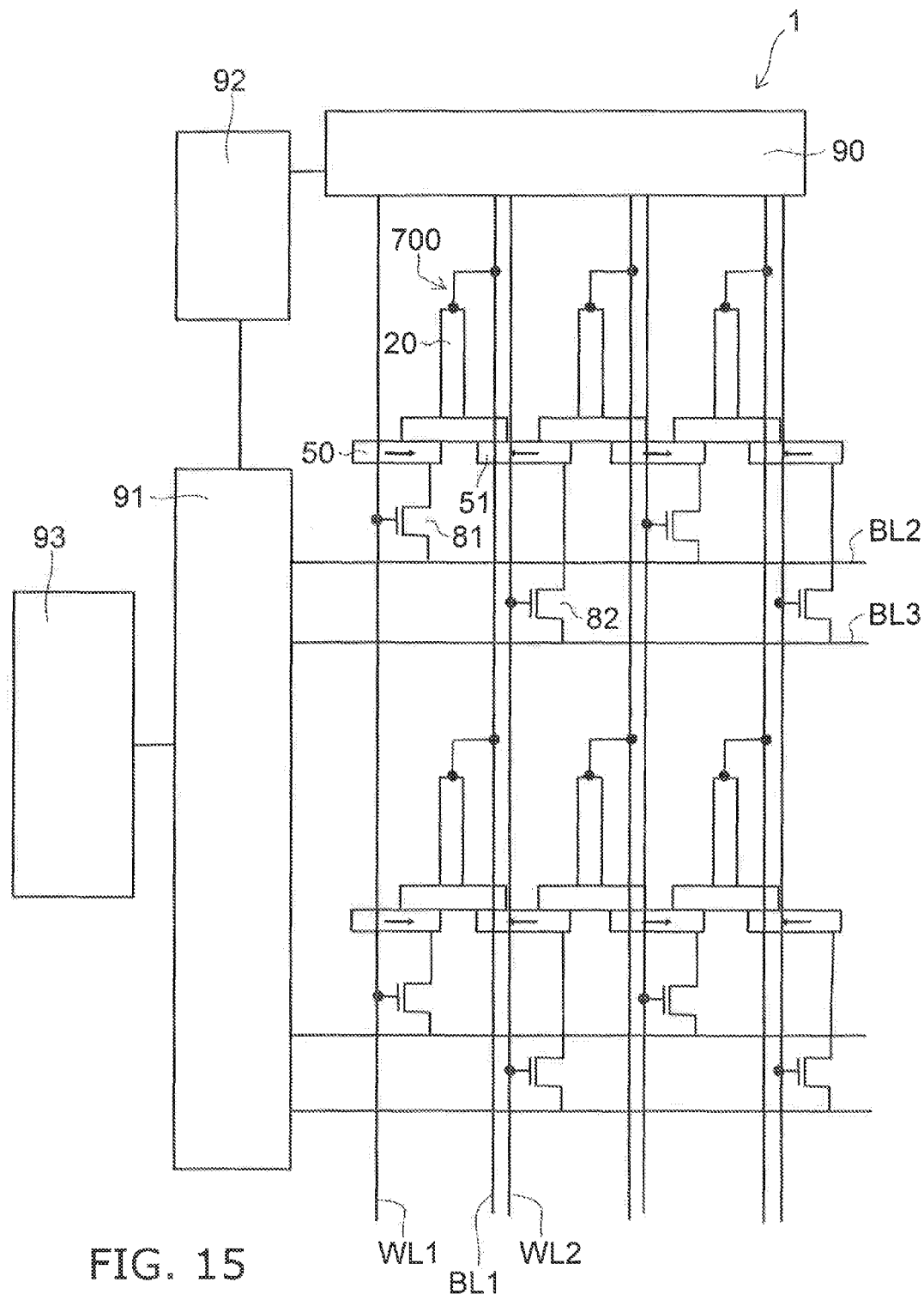
FIG. 15 is a circuit diagram of the magnetic memory device including the multiple magnetic memories.

FIG. 15 is a circuit diagram of the magnetic memory device 1 including the multiple magnetic memory 700.

The circuit configuration of FIG. 15 corresponds to the magnetic memory of FIG. 14 in which the electrodes 40 are linked by a bit line.

The magnetic memory device 1 includes the magnetic memory 700, a first transistor 81, a second transistor 82, a first selector 90, a second selector 91, a current source circuit 92, and a voltage sensor 93.

The first selector 90 is connected to a first bit line BL1, a first word line WL1, and a second word line WL2. The second selector 91. is connected to a second bit line BL2 and a third bit line BL3.

One end (the electrode 40) of the magnetic unit 20 is connected to the first bit line BL1.

The gate of the first transistor 81 is connected to the first word line WL1. One terminal of the first transistor 81 other than the gate is connected to the first fixed magnetic unit 32; and the other terminal is connected to the second bit line BL2.

The gate of the second transistor 82 is connected to the second word line WL2. One terminal of the second transistor other than the gate is connected to the second fixed magnetic unit 33; and the other terminal is connected to the third bit line BL3.

The current source circuit 92 is connected to the first selector 90 and the second selector 91 as a current source. The current source circuit 92 can cause a current to flow between the magnetic unit 20 and at least one of the first fixed magnetic unit 32 or the second fixed magnetic unit 33.

The voltage sensor 93 is connected to the second selector 91. The voltage sensor 93 can sense the voltage generated between the second bit line BL2 connected to the first fixed magnetic unit 32 and the third bit line BL3 connected to the second fixed magnetic unit 33.

Figure 16:
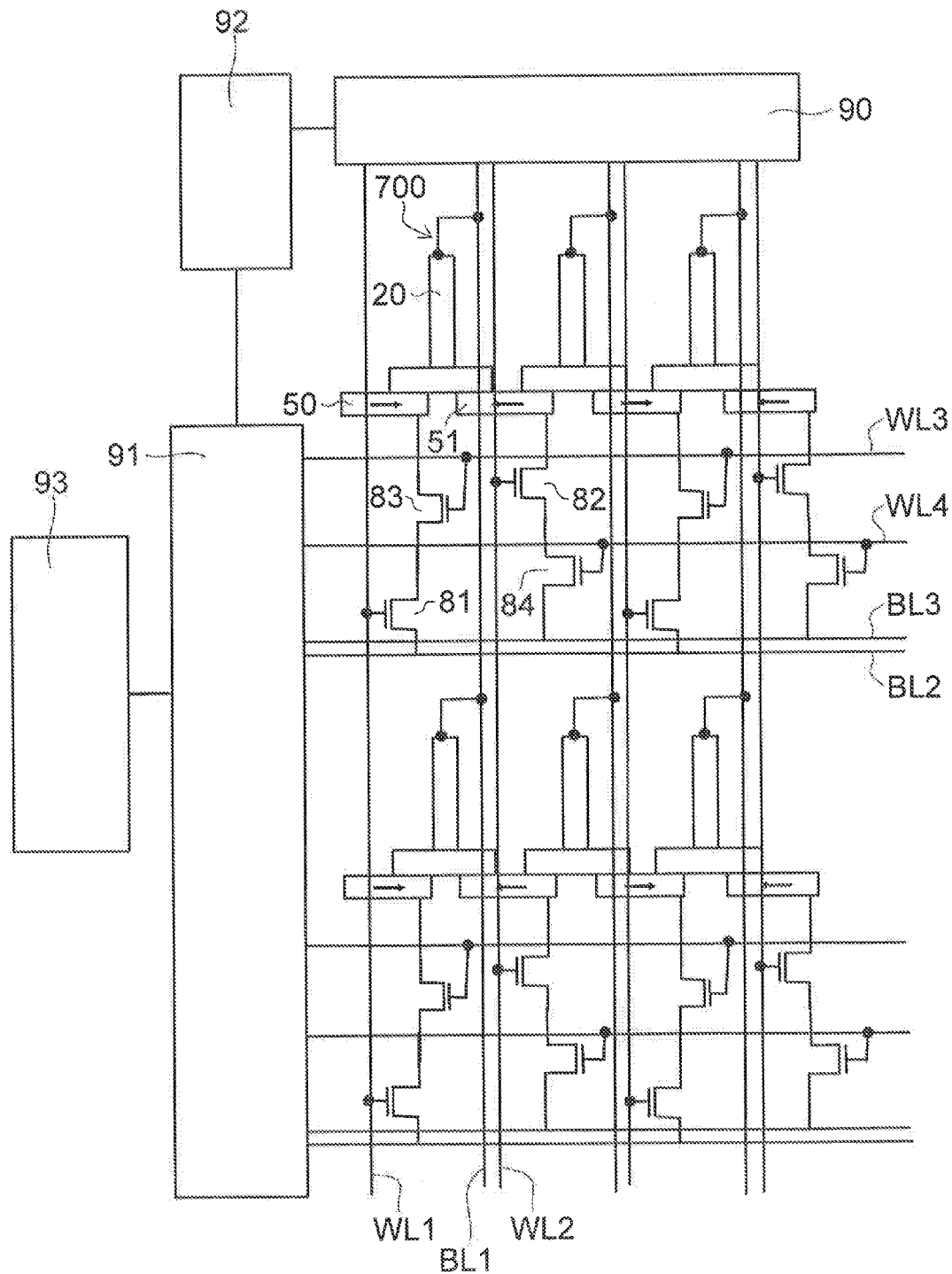
FIG. 16 is a circuit diagram of the magnetic memory device including the multiple magnetic memories.

FIG. 16 is a circuit diagram of a magnetic memory device 2 including the multiple magnetic memory 700.

The circuit configuration of FIG. 16 corresponds to the magnetic memory of FIG. 13 in which the electrodes 40 are linked by a bit line.

Compared to the magnetic memory device 1, the magnetic memory device 2 further includes a third transistor 83 a fourth transistor 84, a third word line WL3, and a fourth word line WL4.

The third word line WL3 and the fourth word line WL4 are connected to the second selector 91.

The gate of the third transistor 83 is connected to the third word line WL3. One terminal of the third transistor 83 other than the gate is connected to the first fixed magnetic unit 32; and the other terminal is connected to one terminal of the first transistor 81 other than the gate. The third transistor 83 is connected to the third bit line BL3 via the first transistor 81.

The gate of the fourth transistor 84 is connected to the fourth word line WL4. One terminal of the fourth transistor 84 other than the gate is connected to the third bit line BL3; and the other terminal is connected to one terminal of the second transistor 82 other than the gate. The fourth transistor 84 is connected to the second fixed magnetic unit 33 via the second transistor 82.

A method for manufacturing the magnetic memory 700 will now be described using FIGS. 17A to 17D and FIGS. 18A to 18C.

FIGS. 17A to 17D are process plan views showing manufacturing processes of the magnetic memory 700.

Figure 18A:
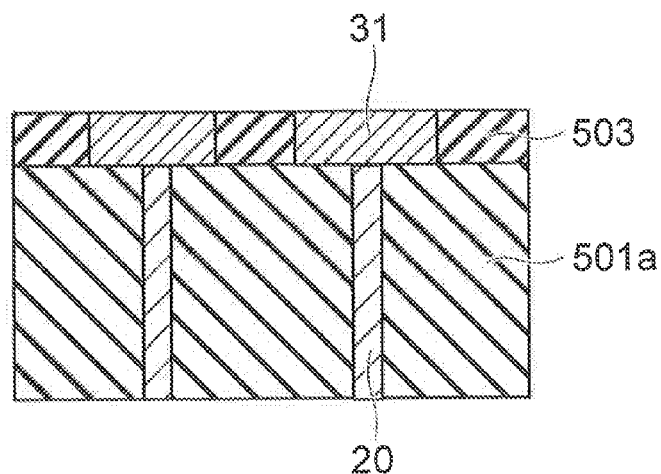
FIGS. 18A to 18C are cross-sectional views of processes, showing manufacturing processes of the magnetic memory.
Figure 18B:
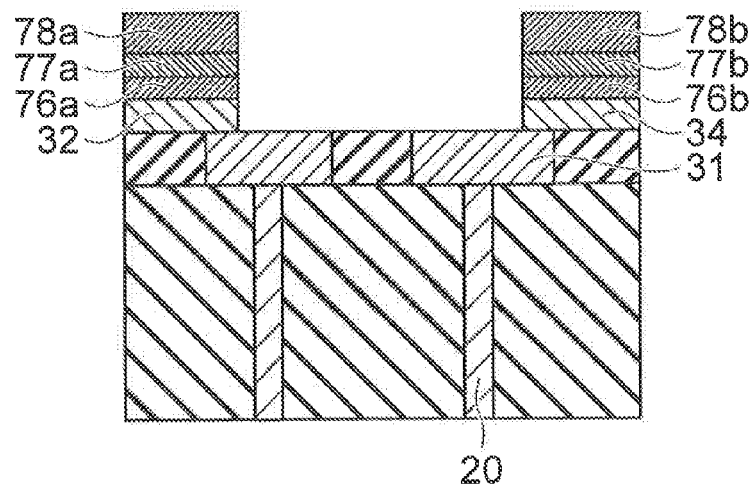
Figure 18C:
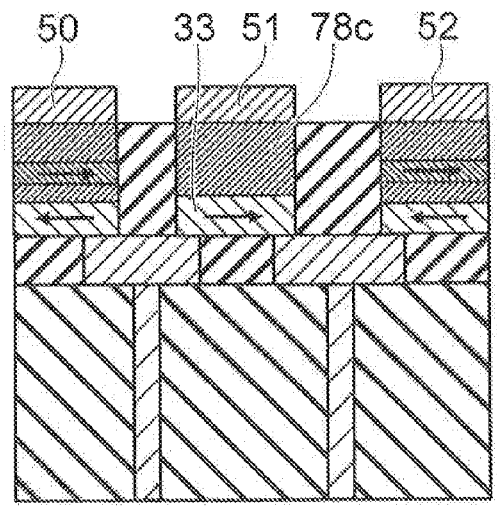

FIGS. 18A to 18C are cross-sectional views of processes, showing manufacturing processes of the magnetic memory 700.

Figure 17A:
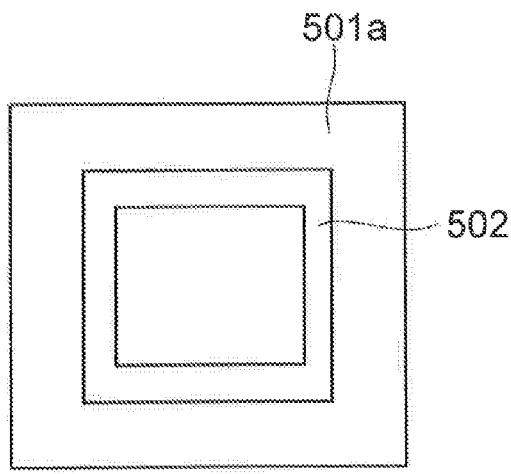
FIGS. 17A to 17D are process plan views showing manufacturing processes of the magnetic memory.
Figure 17B:
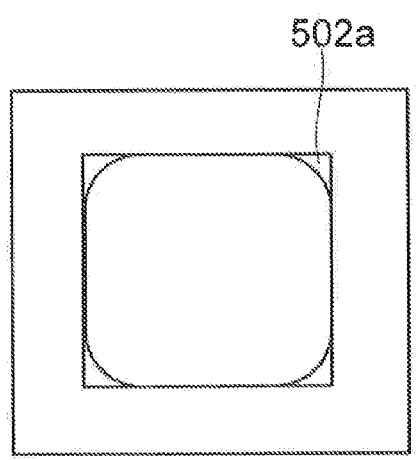
Figure 17C:
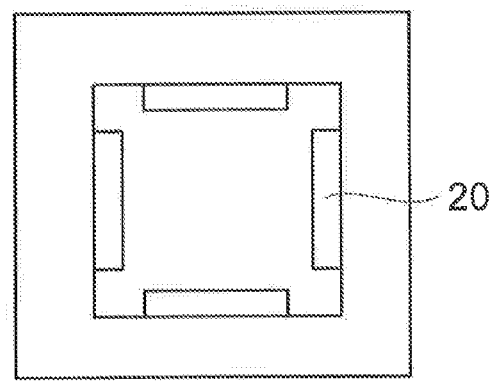
Figure 17D:
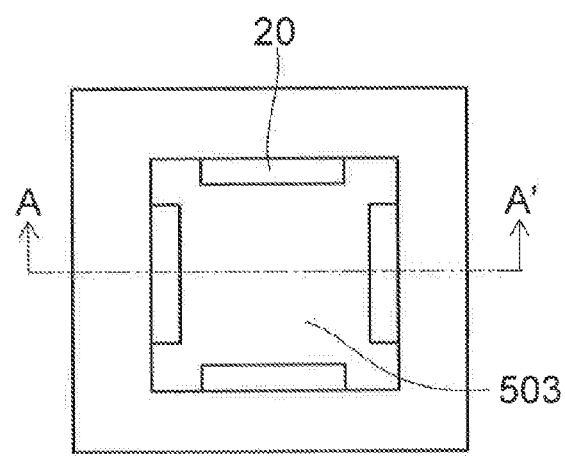

FIGS. 18A to 18C show processes subsequent to FIG. 17D for the A-A' cross section of FIG. 17D.

A hole is made by anodic oxidation in a substrate 501 that is made of a metal such as aluminum, etc., and used as a base member. At this time, for example, a square hole is made as viewed in plan. In the case where aluminum is used as the substrate 501, a substrate 501a of aluminum oxide ($AlO_x$) is formed by the anodic oxidation. A polymer 502 is formed as a film on the side walls of the hole that is made (FIG. 17A). The configuration of the hole may be another polygon such as, for example, a rectangle, a triangle, or a hexagon. As long as the hole has corners, it is unnecessary for the hole to be a precise polygon. A film of a material other than a polymer may be deposited if the film can remain on the corners while the other portions are removed by reactive ion etching described below.

The deposited polymer other than the polymer deposited on the corners of the hole is removed by RIE (FIG. 17B). The remaining polymer 502a that is on the corners functions as a mask for removing a magnetic material that is subsequently deposited on the corners.

A magnet that includes a multilayered film of a film including Co and a film including Ni is deposited by CVD on the inner walls of the hole and on the polymer remaining on the corners. At this time, the magnet that is deposited has an easy magnetization axis in directions perpendicular to the inner walls. The magnet that is deposited on the corners of the hole is removed by removing (performing lift-off of) both the polymer remaining on the corners of the hole and the magnet deposited on the polymer remaining on the corners (FIG. 17C). Thereby, magnetic units 20 that extend in the first direction and are separated from each other inside the hole can be formed. When forming the magnet inside the hole, ALD may be used instead of CVD.

A nonmagnet 503 is filled into the corners and central portion of the hole (FIG. 17D). For example, the nonmagnet 503 is aluminum oxide and is deposited using ALD.

A portion of the magnetic units 20 is exposed by etching two surfaces of the base member on which the aluminum oxide is deposited to make the two surfaces flat. A Cu film is formed on one surface of the base member. Mask formation is performed by coating a resist onto the Cu film and performing electron-beam lithography. The nonmagnetic unit 31 is formed by patterning the Cu film by ion milling using the mask. An aluminum oxide film having a thickness equivalent to that of the nonmagnetic unit 31 is formed. The nonmagnetic unit 31 having an insulator provided around the nonmagnetic unit 31 is formed by removing the mask (FIG. 18A).

A resist is coated onto the exposed surface and a mask is formed on a portion of the surface by electron-beam lithography. A CoFe film, a Ru film, a CoFe film, and an IrMn film are formed in this order on the mask and the exposed surface. The first fixed magnetic unit 32, a nonmagnetic unit 76a, a fixed magnetic unit 77a, an antiferromagnetic unit 78a, the third fixed magnetic unit 34, a nonmagnetic unit 76b, a fixed magnetic unit 77b, and an antiferromagnetic unit 78b are formed by removing the mask (FIG. 18B).

A resist is coated again on the exposed surface; and a mask is formed on a portion of the surface by electron-beam lithography. A CoFe film and an IrMn film are formed in this order on the mask and the exposed surface. The second fixed magnetic unit 33 and an antiferromagnetic unit 78c are formed by removing the mask. An insulator is filled between the fixed magnetic units. The electrodes 50 to 52 are formed on the fixed magnetic units by lift-off (FIG. 18C).

Then, for example, an electrode including a Cr layer and a Au layer is formed to contact the magnetic unit on the side of the base member that is not patterned.

A substrate wherein selection transistors and interconnects are provided is prepared; and the substrate is bonded to the surface where the electrodes of the fixed magnetic units are formed. At this time, the bonding of the substrate is performed so that the electrodes are connected to the corresponding interconnects.

Thus, the magnetic memory 700 is made.

Ninth Embodiment

A magnetic memory 900 according to a ninth embodiment will now be described using FIGS. 19A and 19B.

Figure 19A:
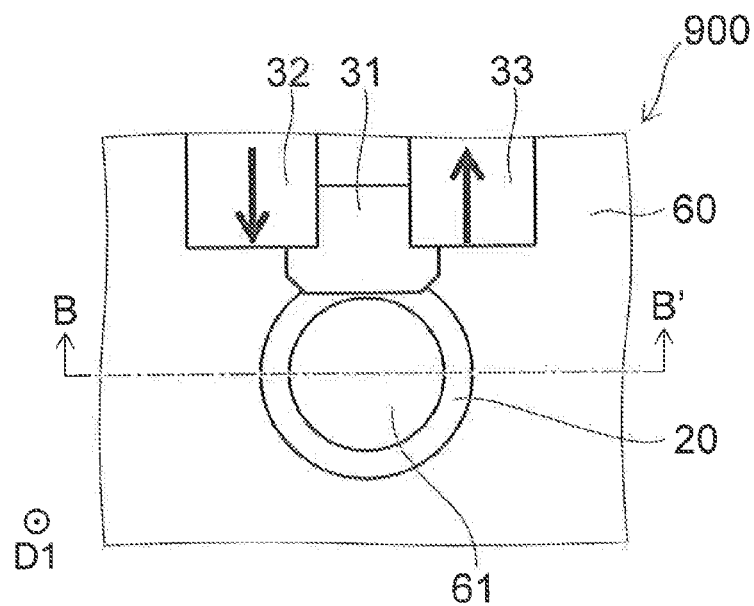
FIG. 19A is a plan view of the magnetic memory according to the ninth embodiment and FIG. 19B is a cross-sectional view of the magnetic memory according to the ninth embodiment.

FIG. 19A is a plan view of the magnetic memory 900 according to the ninth embodiment.

Figure 19B:
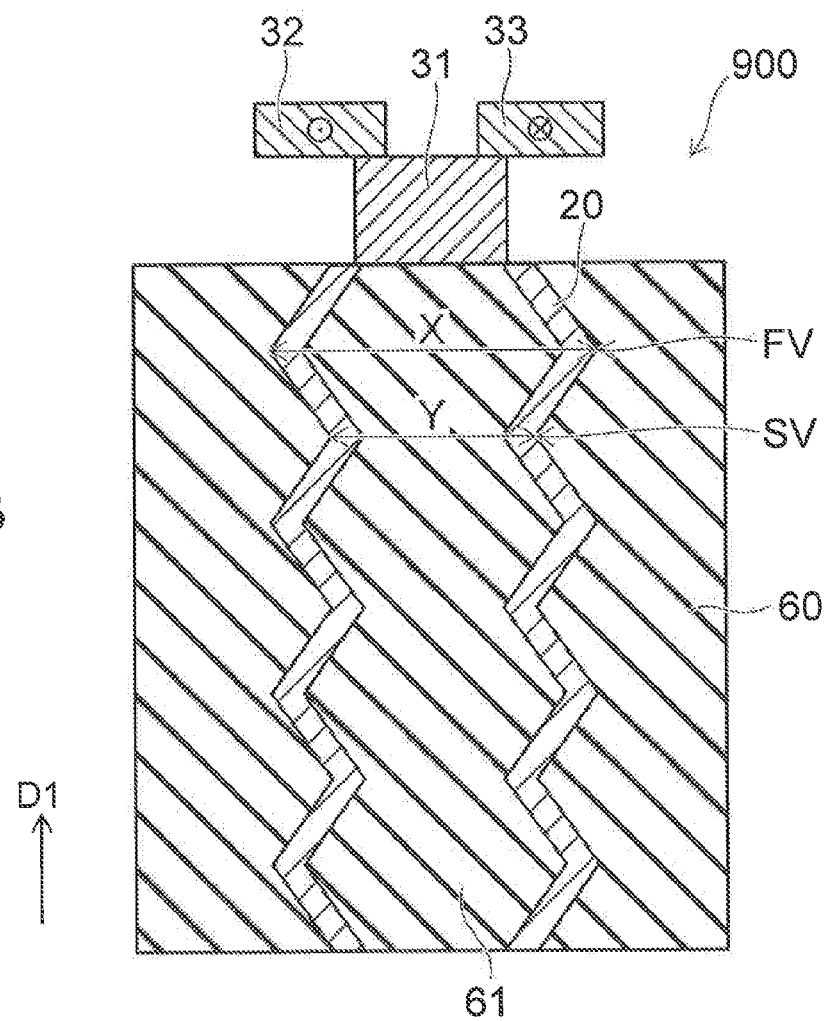

FIG. 19B is a cross-sectional view of the magnetic memory 900 according to the ninth embodiment.

FIG. 19B is a B-B' cross-sectional view of FIG. 19A.

The magnetic memory 900 differs from the magnetic memory 100 mainly in that the magnetic unit 20 has a hollow portion and includes portions in the first direction where the width (the dimension from one end portion to the other end portion in a direction orthogonal to the first direction) is narrow.

As shown in FIG. 19B, in the first direction, the magnetic unit 20 includes portions SV where the width is a second value Y provided between portions FV where the width is a first value X, The second value Y is less than the first value X. The magnetic unit 20 includes the portions SV periodically in the first direction.

The magnetic unit 20 is a member having a columnar configuration having a hollow portion. An insulating unit 61 is provided in the hollow portion by filling a nonmagnetic insulating material. Or, the hollow portion may be a vacuum. The magnetic unit 20 is formed by depositing a magnetic film on the inner wall of a hole made in the insulating unit 60. It is favorable for the easy magnetization axis of the deposited magnetic film to be perpendicular to the first direction from the inner wall of the hole toward the center of the hole.

As shown in FIG. 19A, the magnetic unit 20 has an annular configuration as viewed in plan. The nonmagnetic unit 31 is provided at an end portion of the magnetic unit 20 to contact a portion of the ring of the magnetic unit 20.

It is favorable for a first fixed magnetic unit 32 and the second fixed magnetic unit 33 to be magnetized to provide spin torque to the portion of the magnetic unit 20 contacting the nonmagnetic unit 31 in a direction perpendicular to the first direction from the inner wall of the hole toward the center of the hole.

In the embodiment, the nonmagnetic unit 31, the first fixed magnetic unit 32, and the second fixed magnetic unit 33 are provided on the upper side of the magnetic unit 20 (a side of the magnetic unit 20 in the first direction).

The length of the outer circumference of the portion SV is shorter than the length of the outer circumference of the portion FV. Therefore, the domain wall can exist at the portion SV with an energy lower than that of the domain wall portion FV. Therefore, even when fluctuation occurs in the shift amount of the domain walls, the domain walls stably stop at the portions SV. Operation errors due to shift error of the domain walls can be suppressed because the regions retaining the magnetic domains are stable because the domain walls stably exist at the portions of the magnetic unit 20 having the small diameter.

In the embodiment, the magnetic unit 20 is provided to contact the nonmagnetic unit 31 at the portion SV. The spacing between the portions SV can be set more uniformly by the magnetic unit 20 contacting the nonmagnetic unit 31 at the portion SV. Therefore, it is possible to stably shift the magnetization written to the magnetic unit 20 by the nonmagnetic unit 31 to other portions of the magnetic unit 20.

Tenth Embodiment

A magnetic memory 1000 according to a tenth embodiment will now be described using FIGS. 20A and 20B.

Figure 20A:
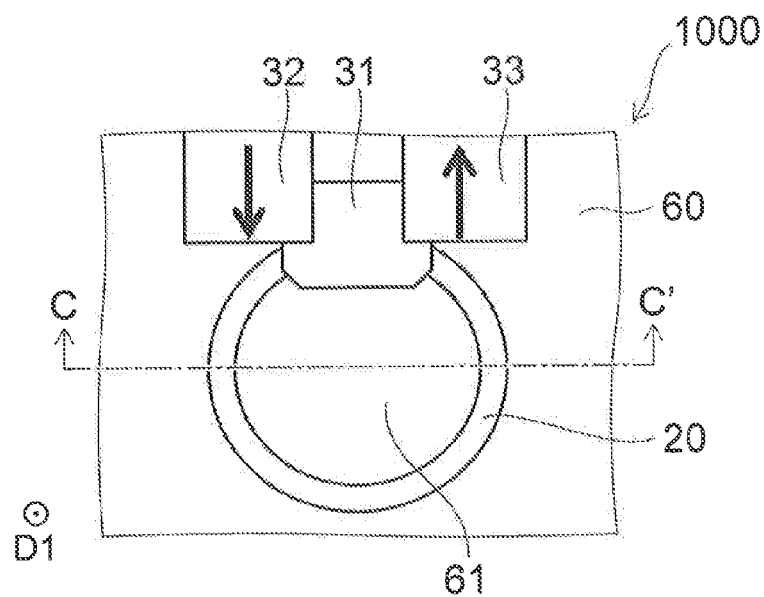
FIG. 20A is a plan view of the magnetic memory 1000 according to the tenth embodiment and FIG. 20B is a cross-sectional view of the magnetic memory 1000 according to the tenth embodiment.

FIG. 20A is a plan view of the magnetic memory 1000 according to the tenth embodiment.

Figure 20B:
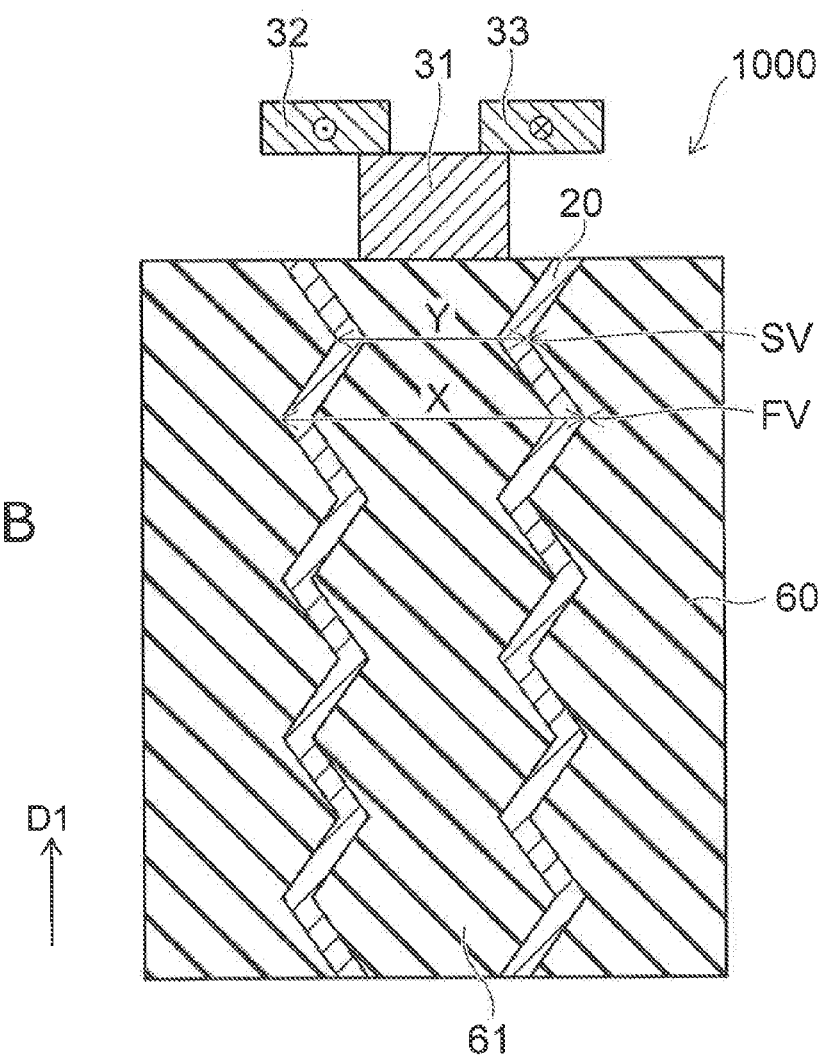

FIG. 20B is a cross-sectional view of the magnetic memory 1000 according to the tenth embodiment.

FIG. 20B is a C-C'cross-sectional view of FIG. 20A.

The magnetic memory 1000 differs from the magnetic memory 900 in that the magnetic unit 20 contacts the nonmagnetic unit 31 at the portion FV.

In the embodiment, the magnetic unit 20 is provided to contact the nonmagnetic unit 31 at the portion FV. Because the magnetic unit 20 contacts the nonmagnetic unit 31 at the portion FV, it is possible to use a lower energy to control the magnetization direction in the region of the magnetic unit 20 contacting the nonmagnetic unit 31.

A method for making the magnetic unit 20 having periodically different widths will now be described using FIGS. 21A to 21C.

Figure 21A:
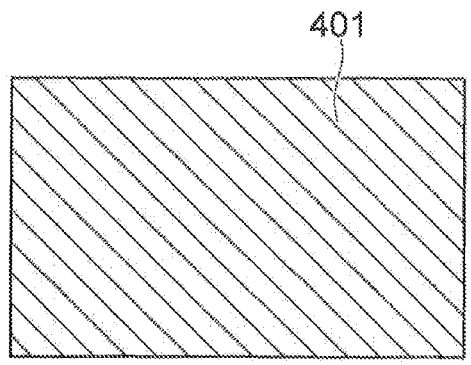
FIGS. 21A to 21C are cross-sectional views of processes, showing manufacturing processes of the magnetic memory according to the tenth embodiment.
Figure 21B:
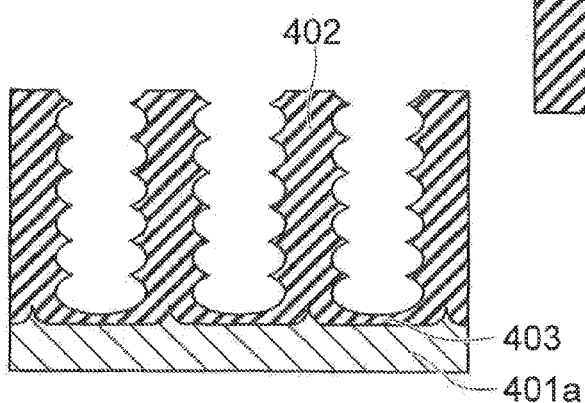
Figure 21C:
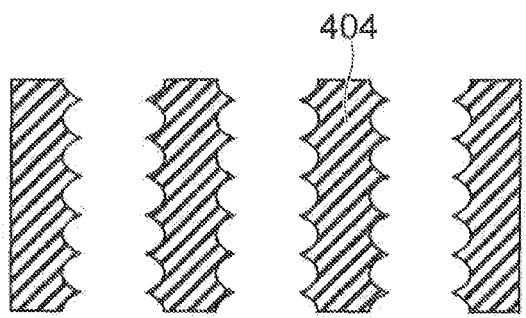

FIGS. 21A to 21C are cross-sectional views of processes, showing manufacturing processes of the magnetic memory according to the tenth embodiment.

First, for example, a substrate 401 of aluminum is prepared as a base member (FIG. 21A).

Then, an oxide (aluminum oxide) 402 is made in which an arrangement of holes is made by performing anodic oxidation of the substrate 401 (FIG. 21B).

In the case where the substrate 401 is aluminum, one of sulfuric acid, oxalic acid, or phosphoric acid or a mixture of these acids may be used as the electrolyte fluid. In particular, sulfuric acid is desirable as the electrolyte fluid because it is possible to make the pitch of the holes narrower, and it is possible to perform the processing at a low voltage that has little effect on the transistors. The value of the pitch of the holes is substantially determined by the type of the electrolyte fluid and the formation positions of the reaction starting points. The value of the width of the hole is substantially determined by the voltage applied to the substrate 401 in the anodic oxidation. The value of the length of the hole is substantially determined by the processing time of the anodic oxidation. For example, in the case where anodic oxidation in which 0.3 mol/L of sulfuric acid is used as the electrolyte fluid is performed at 35° C. with a voltage (a first voltage value) of 25 V applied for 225 minutes, an arrangement of holes is made in which the width of the hole is 30 nm and the length of the hole is 15 μm.

Here, by periodically applying a voltage (a second voltage value) of about 30 V which is higher than 25 V, the portions having the small width in the second direction are formed because the anodic oxidation progresses quickly in the depth direction while the high voltage is applied (a low temperature is desirable at this time). That is, a hole that has a periodically pinched-in structure is made by periodically introducing the voltage of about 30 V because the width in the second direction becomes small at the portions where the voltage of about 30 V is applied.

As an example, a pinched-in portion can be made at a pitch of about 30 nm corresponding to the length of the magnetic domain of one bit by introducing a voltage pulse of 30 V for 0.1 seconds at a period of 24 seconds in the anodic oxidation when applying the voltage of 25 V to the substrate 401. Because the application of the high voltage obstructs straight-line hole growth, it is desirable for the time of the application of the voltage of the second voltage value to be 2 seconds or less.

Subsequently, a barrier layer 403 that exists at the bottom portions of the holes and an unreacted substrate 401a are dissolved and peeled; and a membrane 404 having an arrangement of holes is formed (FIG. 21C). The peeling amount of the barrier layer 403 is adjusted so that the width of one end of the hole is the portion FV having the wide width at this time. Or, surface polishing is performed after peeling the barrier layer 403.

The membrane 404 is bonded on a substrate in which transistors, electrodes, etc., are formed; and subsequently, the magnetic unit 20 having periodically different widths is obtained by implementing processes similar to the processes described using FIGS. 17A to 17D and FIGS. 18A to 18C.

Or, the base member of aluminum, silicon, etc., for which anodic oxidation is to be performed may be formed on the substrate in which the transistors, the electrodes, etc., are formed; and the holes may be made by implementing the processes shown in FIGS. 21A to 21C.

Here, as described in regard to the method for manufacturing the magnetic memory according to the tenth embodiment, it is possible to manufacture the magnetic memory according to the ninth embodiment by adjusting the peeling amount of the barrier layer 403 or adjusting the polishing amount when performing surface polishing after peeling the barrier layer 403 so that the portion SV having the narrow width is positioned at the one end of the hole.

Another method for making the magnetic unit 20 having periodically different widths will now be described using FIGS. 22A to 22C.

Figure 22A:
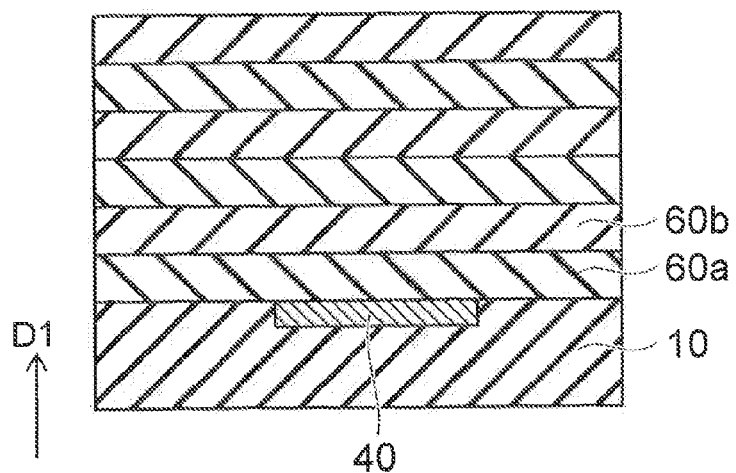
FIGS. 22A to 22C are cross-sectional views of processes, showing manufacturing processes of the magnetic unit.
Figure 22B:
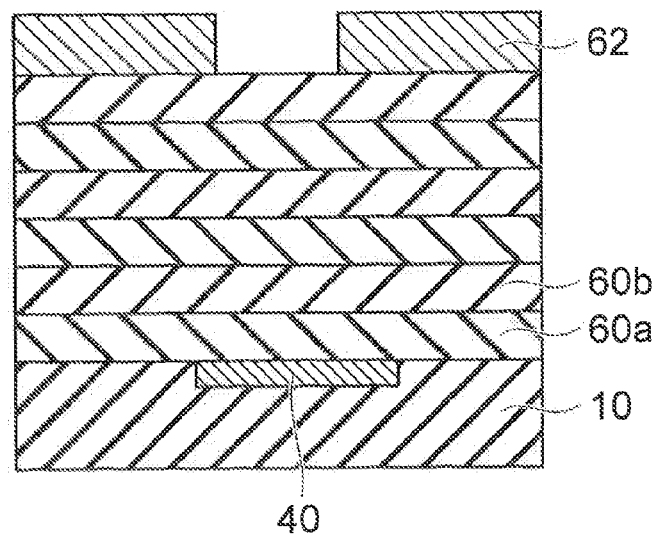
Figure 22C:
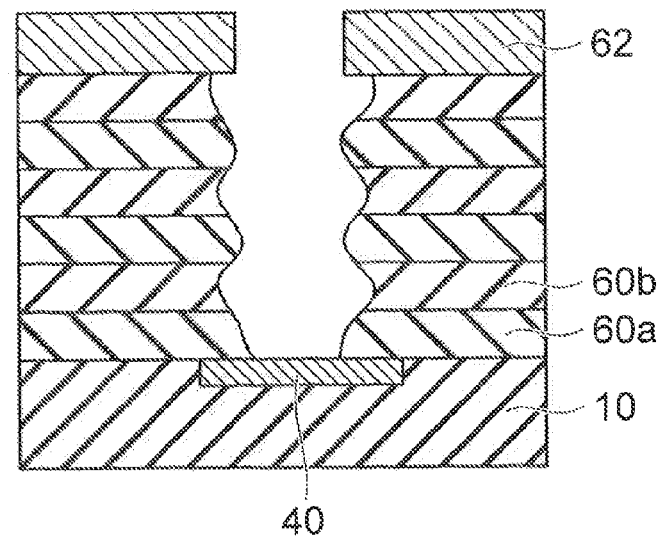

FIGS. 22A to 22C are cross-sectional views of processes, showing manufacturing processes of the magnetic unit 20.

First, a first dielectric film 60a and a second dielectric film 60b are formed alternately on the substrate 10 in which not-shown transistors, the electrodes 40, etc., are formed (FIG. 22A). The first dielectric film 60a and the second dielectric film 60b are included in the base member in which the holes are made. For example, the first dielectric film 60a is a $SiO_2$ film; and the second dielectric film 60b is a SIN film.

A multilayered film made of $SiO_2$ and SIN may be formed by high frequency sputtering, etc.

For example, the $SiO_2$ film is formed on the substrate 10 by using a $SiO_2$ target as the sputtering target, pre-evacuating the chamber to $8\times10^{-7}$ Pa, introducing a gas mixture of argon gas and oxygen gas, generating plasma, and performing sputtering of the target.

For example, the SIN film is formed on the substrate 10 by using a SIN target as the sputtering target, pre-evacuating the chamber to $8\times10^{-7}$ Pa, introducing a gas mixture of argon gas and nitrogen gas, generating plasma, and performing sputtering of the target.

The multilayered film that includes the $SiO_2$ film and the SiN film is formed by repeating the formation of the two types of dielectric films. The total thickness of one $SiO_2$ film and one SIN film corresponds to the dimension of one bit. The total thickness of one $SiO_2$ film and one SIN film is, for example, 30 nm.

Then, a resist is formed on the multilayered film using electron-beam lithography at the positions where the holes are to be made. A metal stacked film 62 of Ti/Au/Ti is formed on the multilayered film and on the resist. A mask made of the Ti/Au/Ti is formed by using lift-off to remove the Ti/Au/Ti at the positions where the holes are to be made (FIG. 22B).

Continuing, the substrate is introduced to a reactive ion etching device. A gas mixture of $CF_4$ and $O_2$ is used as the reactive gas; a reactive plasma is generated; and reactive ion etching of the dielectric film is performed at the positions where the holes are to be made. At this time, holes that have periodic pinched-in portions are made due to the difference between the etching rates of $SiO_2$ and SIN for the reactive gas. The period of the periodic pinched-in portions is the total thickness of one $SiO_2$ film and one SiN film (FIG. 22C).

The Ti/Au/Ti that is used as the mask is unnecessary in the magnetic memory. Therefore, the Ti/Au/Ti is removed by etching or surface polishing after forming the magnetic unit 20 on the inner wall of the hole. For example, the Ti/Au/Ti is removed when performing the process of exposing the end portion of the magnetic unit 20 contacting the nonmagnetic unit 31 at the surface prior to forming the nonmagnetic unit 31. Thus, it is possible to manufacture the magnetic memory according to the ninth or tenth embodiment.

In the specification of the application, the words "orthogonal," "perpendicular," and "parallel" include the fluctuation due to manufacturing processes. Accordingly, it is sufficient to be substantially orthogonal, perpendicular, or parallel.

Clause 1

A method for operating a magnetic memory, the magnetic memory including:

a magnetic unit extending in a first direction and including multiple magnetic domains arranged in the first direction;

a nonmagnetic unit contacting one end of the magnetic unit;

a first fixed magnetic unit separated from the magnetic unit, the first fixed magnetic unit contacting the nonmagnetic unit;

a second fixed magnetic unit separated from the magnetic unit and the first fixed magnetic unit, the second fixed magnetic unit being in contact with the nonmagnetic unit and magnetized in a direction different from a magnetization direction of the first fixed magnetic unit;

a first electrode connected to one other end of the magnetic unit;

a second electrode connected to the first fixed magnetic unit; and a third electrode connected to the first fixed magnetic unit, the method for operating comprising causing a current to flow in a first path from the first electrode toward the second electrode or in a second path from the first electrode toward the third electrode to control a magnetization direction in a region of the magnetic unit contacting the nonmagnetic unit to correspond to the first path or the second path.

Clause 2

The method for operating the magnetic memory according to clause 1, where the multiple magnetic domains of the first magnetic unit are moved toward the first electrode by causing a current to flow in the first path or the second path after the controlling of the magnetization direction in the region of the magnetic unit contacting the nonmagnetic unit.

Clause 3

The method for operating the magnetic memory according to clause 1, wherein the multiple magnetic domains of the magnetic unit are moved toward the third electrode simultaneously with the controlling of the magnetization direction in the region of the magnetic unit contacting the nonmagnetic unit by causing a current to flow in the first path or the second path.

Clause 4

A method for operating a magnetic memory, the magnetic memory including:

a magnetic unit extending in a first direction and including multiple magnetic domains arranged in the first direction;

a nonmagnetic unit contacting one end of the magnetic unit;

a first fixed magnetic unit separated from the magnetic unit, the first fixed magnetic unit contacting the nonmagnetic unit;

a second fixed magnetic unit separated from the magnetic unit and the first fixed magnetic unit, the second fixed magnetic unit being in contact with the nonmagnetic unit and magnetized in a direction different from a magnetization direction of the first fixed magnetic unit;

a first electrode connected to one other end of the magnetic unit;

a second electrode connected to the first fixed magnetic unit; and a third electrode connected to the second fixed magnetic unit, the method for operating comprising causing a current to flow between the second electrode and the third electrode to control a magnetization direction in a region of the magnetic unit contacting the nonmagnetic unit to correspond to a direction of the flow of the current.

Clause 5

The method for operating the magnetic memory according to clause 4, wherein the multiple magnetic domains of the magnetic unit are moved toward the first electrode by causing a current to flow between the first electrode and at least one of the second electrode or the third electrode after the controlling of the magnetization direction in the region of the magnetic unit contacting the nonmagnetic unit.

Clause 6

A method for operating a magnetic memory, the magnetic memory including:

a magnetic unit extending in a first direction and including multiple magnetic domains arranged in the first direction;

a nonmagnetic unit contacting one end of the magnetic unit;

a first fixed magnetic unit separated from the magnetic unit, the first fixed magnetic unit contacting the nonmagnetic unit;

a second fixed magnetic unit separated from the magnetic unit and the first fixed magnetic unit, the second fixed magnetic unit being in contact with the nonmagnetic unit and magnetized in a direction different from a magnetization direction of the first fixed magnetic unit;

a first electrode connected to one other end of the magnetic unit;

a second electrode connected to the first fixed magnetic unit; and a third electrode connected to the second fixed magnetic unit, the method for operating comprising causing a current to flow between the first electrode and the second electrode to move the multiple magnetic domains of the magnetic unit.

Clause 7

The method for operating the magnetic memory according to clause 6, wherein a magnetization direction in a region of the magnetic unit contacting the nonmagnetic unit is read by causing a current to flow between the first electrode and the second electrode and sensing a voltage difference between the second electrode and the third electrode after the moving of the multiple magnetic domains of the magnetic unit.

Clause 8

The method for operating the magnetic memory according to clause 6, wherein a magnetization direction in a region of the magnetic unit contacting the nonmagnetic unit is controlled to correspond to a first path or a second path by causing a current to flow in the first path or in the second path after moving the multiple magnetic domains of the magnetic unit, the first path being from the first electrode toward the second electrode, the second path being from the first electrode toward the third electrode.

Clause 9

The method for operating the magnetic memory according to clause 6, wherein a magnetization direction in a region of the magnetic unit contacting the nonmagnetic unit is controlled to correspond to a direction of the flow of the current by causing a current to flow between the second electrode and the third electrode after the moving of the multiple magnetic domains of the magnetic unit.

Clause 10

A method for manufacturing a magnetic memory, comprising:

making a hole in a base member to extend in a first direction;

depositing a film on an inner wall of the hole;

removing the film other than the film on a corner of the hole;

depositing a magnetic material on the inner wall of the hole and on the film remaining on the corner;

forming a magnetic unit extending in the first direction by removing both the film remaining on the corner and the magnetic material deposited on the film remaining on the corner;

forming a nonmagnetic unit contacting the magnetic unit; and forming a first fixed magnetic unit and a second fixed magnetic unit separated from each other and separated from the magnetic unit, the first fixed magnetic unit and the second fixed magnetic unit contacting the nonmagnetic unit.

Clause 11

The method for manufacturing the magnetic memory according to clause 10, wherein the hole extends in the first direction and periodically includes portions in the first direction, a dimension in a second direction intersecting the first direction being small for each of the portions.

Clause 12

The method for manufacturing the magnetic memory according to clause 11, wherein the hole is made by performing anodic oxidation of the base member by alternately applying a first voltage and a second voltage, the second voltage being higher than the first voltage.

Clause 13

The method for manufacturing the magnetic memory according to clause 12, wherein the time the first voltage is applied is longer than the time the second voltage is applied.

Clause 14

The method for manufacturing the magnetic memory according to clause 12 or 13, wherein a reaction starting point is formed in the prepared base member, and the anodic oxidation is performed for the base member including the reaction starting point.

Clause 15

The method for manufacturing the magnetic memory according to clause 11, wherein the base member includes a first dielectric film and a second dielectric film stacked alternately, and the hole is made by performing reactive ion etching using a reactive gas having different etching rates for the first dielectric film and the second dielectric film.

Clause 16

The method for manufacturing the magnetic memory according to any one of clauses 10 to 15, wherein the magnetic material deposited on the inner wall of the hole has an easy magnetization axis in a direction perpendicular to the inner wall of the hole.

Clause 17

A method for operating a magnetic memory, the magnetic memory including:

a magnetic unit extending in a first direction and including a plurality of magnetic domains arranged in the first direction;

a nonmagnetic unit contacting one end of the magnetic unit;

a first fixed magnetic unit separated from the magnetic unit, the first fixed magnetic unit contacting the nonmagnetic unit;

a second fixed magnetic unit separated from the magnetic unit and the first fixed magnetic unit, the second fixed magnetic unit being in contact with the nonmagnetic unit and magnetized in a direction different from a magnetization direction of the first fixed magnetic unit;

a first electrode connected to one other end of the magnetic unit;

a second electrode connected to the first fixed magnetic unit; and a third electrode connected to the second fixed magnetic unit, the method for operating comprising reading a magnetization direction of a region of the magnetic unit contacting the nonmagnetic unit by causing a first current to flow between the first electrode and the second electrode and by sensing a voltage between the second electrode and the third electrode.

Clause 18

The method for operating the memory according to clause 17, wherein after the reading of the magnetization direction of the region of the magnetic unit contacting the nonmagnetic unit, a second current larger than the first current is caused to flow between the first electrode and the second electrode to move the plurality of magnetic domains of the magnetic unit toward the nonmagnetic unit.

Hereinabove, embodiments of the invention are described with reference to specific examples. However, the invention is not limited to these specific examples. For example, one skilled in the art may similarly practice the invention by appropriately selecting specific configurations of components such as the magnetic unit, the nonmagnetic unit, the fixed magnetic unit, the electrode, the current source circuit, the voltage sensor, the selector, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all embodiments practicable by an appropriate design modification by one skilled in the art based on the magnetic memory, the magnetic memory device, the method for operating magnetic memory, and the method for manufacturing magnetic memory described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory, comprising:
    a first magnetic unit extending in a first direction, the first magnetic unit including a plurality of magnetic domains arranged in the first direction;
    a first nonmagnetic unit contacting one end of the first magnetic unit;
    a first fixed magnetic unit separated from the first magnetic unit, the first fixed magnetic unit contacting the first nonmagnetic unit;
    a second fixed magnetic unit separated from the first magnetic unit and the first fixed magnetic unit, the second fixed magnetic unit being in contact with the first nonmagnetic unit and magnetized in a direction different from a magnetization direction of the first fixed magnetic unit;
    a first electrode connected to one other end of the first magnetic unit;
    a second electrode connected to the first fixed magnetic unit; and
    a third electrode connected to the second fixed magnetic unit.

2. The memory according to claim 1, wherein the first nonmagnetic unit is provided between the first fixed magnetic unit and the first magnetic unit and between the second fixed magnetic unit and the first magnetic unit.

3. The memory according to claim 1, further comprising:
    a second magnetic unit separated from the first magnetic unit, the second magnetic unit extending in the first direction and including a plurality of magnetic domains arranged in the first direction;
    a second nonmagnetic unit contacting one end of the second magnetic unit;
    a third fixed magnetic unit separated from the second magnetic unit and the second fixed magnetic unit, the third fixed magnetic unit being in contact with the second nonmagnetic unit and magnetized in a direction different from a magnetization direction of the second fixed magnetic unit;
    a fourth electrode connected to one other end of the second magnetic unit; and
    a fifth electrode connected to the third fixed magnetic unit, the second nonmagnetic unit being in contact with the second fixed magnetic unit and separated from the first nonmagnetic unit.

4. The memory according to claim 1, further comprising:
    a second magnetic unit separated from the first magnetic unit, the second magnetic unit extending in the first direction and including a plurality of magnetic domains arranged in the first direction;
    a third fixed magnetic unit separated from the second magnetic unit and the second fixed magnetic unit, the third fixed magnetic unit being in contact with the first nonmagnetic unit and magnetized in a direction different from a magnetization direction of the second fixed magnetic unit;
    a fourth electrode connected to the third fixed magnetic unit; and
    a fifth electrode connected to one end of the second magnetic unit,
    one other end of the second magnetic unit contacting the first nonmagnetic unit,
    when projected onto a plane orthogonal to the first direction, at least a portion of the first magnetic unit being positioned between the first fixed magnetic unit and the second fixed magnetic unit, and at least a portion of the second magnetic unit being positioned between the second fixed magnetic unit and the third fixed magnetic unit.

5. The memory according to claim 1, wherein an easy magnetization axis of the first magnetic unit is orthogonal to the first direction.

6. The memory according to claim 1, wherein an easy magnetization axis of the first magnetic unit, an easy magnetization axis of the first fixed magnetic unit, and an easy magnetization axis of the second fixed magnetic unit are parallel to each other.

7. The memory according to claim 1, wherein the magnetization direction of the first fixed magnetic unit and the magnetization direction of the second fixed magnetic unit are opposite to each other.

8. The memory according to claim 1, further comprising an antiferromagnetic unit provided between the second fixed magnetic unit and the second electrode.

9. The memory according to claim 8, further comprising:
    a third nonmagnetic unit provided to have the second fixed magnetic unit positioned between the third nonmagnetic unit and the first nonmagnetic unit; and
    a fourth fixed magnetic unit provided to have the third nonmagnetic unit positioned between the fourth fixed magnetic unit and the second fixed magnetic unit,
    the fourth fixed magnetic unit being provided between the antiferromagnetic layer and the third nonmagnetic unit.

10. The memory according to claim 1, further comprising a magnetization direction adjuster provided between the second fixed magnetic unit and the second electrode, the magnetization direction adjuster including a magnetic material.

11. The memory according to claim 1, wherein the first nonmagnetic unit includes an insulating unit at a portion of the first nonmagnetic unit contacting the first magnetic unit.

12. The memory according to claim 1, wherein the first nonmagnetic unit includes graphite or a material including at least one selected from copper, aluminum, silver, and silicon.

13. The memory according to claim 1, further comprising:
a current source causing a current to flow between the first electrode and at least one of the second electrode or the third electrode; and
a voltage sensor sensing a voltage between the second electrode and the third electrode.

14. The memory according to claim 13, wherein the current source further causes a current to flow between the second electrode and the third electrode.

15. A magnetic memory device, comprising:
a plurality of the magnetic memory according to claim 1;
a plurality of first bit lines connected respectively to the first electrodes;
a plurality of first transistors, each of the plurality of first transistors including a gate connected to a first word line, one terminal other than the gate connected to the corresponding second electrode, and one other terminal other than the gate connected to a second bit line; and
a plurality of second transistors, each of the plurality of second transistors including a gate connected to a second word line, one terminal other than the gate connected to the corresponding third electrode, and one other terminal other than the gate connected to a third bit line.

* * * * *